(12) United States Patent
Shishido et al.

(10) Patent No.: US 7,105,929 B2
(45) Date of Patent: Sep. 12, 2006

(54) SEMICONDUCTOR DEVICE

(75) Inventors: Katsuhiko Shishido, Takatsuki (JP);
Motonobu Nishimura, Otsu (JP);
Hisakazu Kotani, Takaraduka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 313 days.

(21) Appl. No.: 10/791,805

(22) Filed: Mar. 4, 2004

(65) Prior Publication Data
US 2004/0173885 A1 Sep. 9, 2004

(30) Foreign Application Priority Data
Mar. 7, 2003 (JP) .............................. 2003-062283

(51) Int. Cl.
*H01L 23/48* (2006.01)
(52) U.S. Cl. ...................................... 257/777; 257/686
(58) Field of Classification Search ................ 257/686, 257/777
See application file for complete search history.

(56) References Cited
U.S. PATENT DOCUMENTS
6,781,243 B1 * 8/2004 Li et al. ...................... 257/777

2001/0011766 A1 * 8/2001 Nishizawa et al. ......... 257/685

FOREIGN PATENT DOCUMENTS
JP 2003-23136 A 1/2003

* cited by examiner

Primary Examiner—Douglas W. Owens
(74) Attorney, Agent, or Firm—McDermott Will & Emery LLP

(57) ABSTRACT

A first semiconductor chip 102 includes an integrated circuit formed on a face which is shown upwards in FIG. 2. A second semiconductor chip 103 includes an integrated circuit formed on a face which is shown downwards in FIG. 2. Between the first semiconductor chip 102 and the second semiconductor chip 103, a non-conductive die pad 107 is interposed. The die pad 107 is provided with connection members 110 protruding from the first semiconductor chip 102 and the second semiconductor chip 103. The connection members 110 are plated on their surfaces so as to be electrically conductive. The integrated circuit on the first semiconductor chip 102 and the integrated circuit on the second semiconductor chip 103 are interconnected by two inter-chip connection wires 104a and 104b, via the connection members 110. Thus, there is provided a semiconductor device composed of a plurality of internally connected semiconductor chips, such that the semiconductor device is easy to produce and requires a reduced number of component elements.

21 Claims, 16 Drawing Sheets

SEMICONDUCTOR DEVICE

BACKGROUND OF THE INVENTION

1. Field of the Invention

The present invention relates to a semiconductor device, and more particularly to a semiconductor device composed of a plurality of laminated semiconductor chips having substantially the same outer contour with one another, with an integrated circuit being formed on one of the principal faces of each semiconductor chip.

2. Description of the Background Art

In recent years, in the field of semiconductor devices, so-called "system-in-package" technology has gained more importance. According to system-in-package" technology, a single semiconductor device incorporating a plurality of semiconductor chips having different functions is constructed. In addition to being downsized, a semiconductor device constructed according to this technology can provide a realize a highly functional system where the semiconductor chips are able to mutually exchange data within the semiconductor device.

A conventional semiconductor device which is constructed according to system-in-package technology is disclosed in Japanese Patent Laid-Open Publication No. 2003-23136. As shown in FIG. 18, this conventional semiconductor device has a structure such that a memory chip 1014 and a microcomputer chip 1015 are attached to each other "back-to-back", i.e., so that a face of each of the chips 1014 and 1015 having circuitry formed thereon is facing outwards. The metal wires taken out from the memory chip 1014 and the microcomputer chip 1015 are electrically connected to each other, via a conductive common lead 1024. Thus, electrical conduction between the memory chip 1014 and the microcomputer chip 1015 is achieved.

However, in the conventional semiconductor device, the conductive common lead 1024 is composed as a separated element from external terminals 1025 and a die pad 1017, and as such, needs to be affixed by means of an insulative piece 1026 as shown in FIG. 18, in order to be stabilized in place within the semiconductor device. This results in an increase in the number of component elements used in the semiconductor device. Furthermore, in order to connect the common lead 1024 to both the memory chip 1014 and the microcomputer chip 1015 by means of metal wires, it is necessary to position the common lead 1024 precisely with respect to both the memory chip 1014 and the microcomputer chip 1015. Such a precise positioning for the common lead 1024 is a hindrance to a rapid assembling of the semiconductor device.

SUMMARY OF THE INVENTION

Therefore, an object of the present invention is to provide a semiconductor device composed of a plurality of interconnected semiconductor chips, such that the semiconductor device is easy to produce and requires a reduced number of component elements.

The present invention has the following features to attain the object mentioned above.

A first embodiment of the present invention is directed to a semiconductor device including a plurality of layers of semiconductor chips having substantially the same outer contour, with an integrated circuit being formed on a principal face of each semiconductor chip, comprising: anonconductive layer having a conductive portion provided thereon, and an internal connection member for internally connecting the integrated circuits formed on the plurality of semiconductor chips via the conductive portion provided on the non-conductive layer, wherein the conductive portion provided on the non-conductive layer only mediates internal connection between the integrated circuits formed on the plurality of semiconductor chips.

According to a second aspect based on the first aspect, the plurality of semiconductor chips comprise a first semiconductor chip and a second semiconductor chip, and the internal connection member comprises: a first connection member for connecting the first semiconductor chip to the conductive portion; and a second connection member for connecting the second semiconductor chip to the conductive portion.

According to a third aspect based on the second aspect, the non-conductive layer has a circuit formed thereon, and the conductive portion comprises a conductive subportion which is connected to the first connection member and a conductive subportion which is connected to the second connection member, the conductive subportions being in electrical conduction by way of the circuit formed on the non-conductive layer.

According to a fourth aspect based on the third aspect, the non-conductive layer includes a circuit formed on each of two principal faces thereof.

According to a fifth aspect based on the second aspect, the non-conductive layer is layered between the first semiconductor chip and the second semiconductor chip.

According to a sixth aspect based on the fifth aspect, the first semiconductor chip and the second semiconductor chip are disposed so that the respective principal faces of the first and second semiconductor chips having the integrated circuits formed thereon face away from each other, with the non-conductive layer being interposed between the other principal faces of the first and second semiconductor chips.

According to a seventh aspect based on the sixth aspect, the conductive subportion which is connected to the first connection member is formed on a principal face of the non-conductive layer which is oriented in the same direction as the principal face of the first semiconductor chip on which the integrated circuit is formed.

According to an eighth aspect based on the first aspect, the non-conductive layer is a mount on which the plurality of semiconductor chips are placed.

According to a ninth aspect based on the first aspect, the conductive portion is formed by plating, with a conductive material, a portion of the non-conductive layer that lies outside of an outer contour of the plurality of semiconductor chips when the plurality of semiconductor chips and the non-conductive layer are layered in place.

According to a tenth aspect based on the ninth aspect, the conductive material is a metal.

According to an eleventh aspect based on the ninth aspect, the portion of the non-conductive layer that lies outside of the outer contour of the plurality of semiconductor chips is a protrusion from the non-conductive layer.

According to a twelfth aspect based on the ninth aspect, the plurality of semiconductor chips and the non-conductive layer are encased in a package, the non-conductive layer further includes a plurality of supporting legs for stabilizing to the package a portion of the non-conductive layer on which the plurality of semiconductor chips are placed, the plurality of supporting legs being connected to one another by a bridge, and the portion of the non-conductive layer that lies outside of the outer contour of the plurality of semiconductor chips forms the bridge.

According to a thirteenth aspect based on the first aspect, the conductive portion is composed of a conductive piece embedded in an aperture formed through a portion of the non-conductive layer that lies outside of an outer contour of the plurality of semiconductor chips when the plurality of semiconductor chips and the non-conductive layer are layered in place.

According to a fourteenth aspect based on the fifth aspect, the first connection member is composed of a conductive piece embedded in an aperture formed through the first semiconductor chip, the second connection member is composed of a conductive piece embedded in an aperture formed through the second semiconductor chip, the first connection member and the second connection member are formed in positions which coincide when the first semiconductor chip and the second semiconductor chip are layered in place, and the conductive portion comprises conductive pieces embedded in apertures formed through portions of the non-conductive layer that come in contact with the first connection member and the second connection member, respectively, when the first semiconductor chip and the second semiconductor chip are layered in place.

According to a fifteenth aspect based on the thirteenth or fourteenth aspect, the conductive pieces comprised by the conductive portion are metal pieces.

According to a sixteenth aspect based on the fourteenth aspect, the conductive piece composing the first connection member is a metal piece.

According to a seventeenth aspect based on the fifth aspect, the first connection member is composed of a conductive piece embedded in an aperture formed through the first semiconductor chip, the second connection member is composed of a conductive piece embedded in an aperture formed through the second semiconductor chip, and the conductive portion comprises: a conductive subportion composed of a conductive piece embedded in an aperture formed through a portion of the non-conductive layer that comes in contact with the first connection member when the first semiconductor chip and the second semiconductor chip are layered in place, and a circuit for electrically connecting the conductive subportion to a portion of the non-conductive layer that comes in contact with the second connection member when the first semiconductor chip and the second semiconductor chip are layered in place.

According to an eighteenth aspect based on the second aspect, the first semiconductor chip is disposed so that a principal face of the first semiconductor chip not bearing the integrated circuit opposes one of principal faces of the non-conductive layer, and the second semiconductor chip is disposed so that a principal face of the second semiconductor chip having the integrated circuit formed thereon opposes the other principal face of the non-conductive layer.

According to a nineteenth aspect based on the eighteenth aspect, the second connection member is a metal bump provided on the second semiconductor chip, the conductive portion including: a conductive subportion embedded in an aperture formed through a portion of the non-conductive layer that comes in contact with the bump when the second semiconductor chip and the non-conductive layer are layered in place, and a circuit, formed on the principal face of the non-conductive layer opposed by the first semiconductor chip, for electrically connecting the conductive subportion to the first connection member.

According to a twentieth aspect based on the second aspect, the second semiconductor chip is disposed so that a principal face of the second semiconductor chip not bearing the integrated circuit contacts a principal face of the non-conductive layer, the semiconductor device further comprising: a spacer having an outer contour which is smaller than an outer contour of the first semiconductor chip and the second semiconductor chip, the spacer being disposed on the principal face of the second semiconductor chip having the integrated circuit formed thereon, and the first semiconductor chip is disposed so that a principal face of the first semiconductor chip not bearing the integrated circuit contacts an upper face of the spacer.

A twenty-first aspect of the present invention is directed to a semiconductor device including a plurality of layers of semiconductor chips having substantially the same outer contour, with an integrated circuit being formed on a principal face of each semiconductor chip, comprising: a non-conductive layer having a first conductive portion and a second conductive portion provided thereon, and an internal connection member for internally connecting the integrated circuits formed on the plurality of semiconductor chips via the first conductive portion provided on the non-conductive layer, wherein the second conductive portion provided on the non-conductive layer is a terminal for connecting the integrated circuits formed on the plurality of semiconductor chips to an external circuit.

Thus, according to the first aspect above, a conductive portion is formed on the non-conductive piece so that it is unnecessary to pay particular attention to the positioning of the conductive portion when assembling the semiconductor chips and other elements. Since the conductive portion is provided on the non-conductive piece, the number of component elements used in the semiconductor device can be reduced. Since the conductive portion is not used for external connection of the semiconductor device, no external leads need to be wasted for internal connection purposes as in the case of conventional semiconductor devices.

According to the second aspect above, integrated circuits formed on the first semiconductor chip and the second semiconductor chip composing the semiconductor device can be internally connected.

According to the third aspect above, a circuit formed on a principal face of the non-conductive layer makes it possible to interconnect the conductive subportion which is connected to the first connection member and the conductive subportion which is connected to the second connection member even in the case where they are in distant positions. As a result, even if an output section of the integrated circuit on the first semiconductor chip and an output section of the integrated circuit on the second semiconductor chip are distant from each other, then can still be internally connected.

According to the fourth aspect above, the aforementioned circuit is formed on each of the two principal faces of the non-conductive layer, thus providing for a greater variety of internal connection methods. For example, a circuit which would otherwise have intersecting paths on the non-conductive layer can be split into non-intersecting sub-circuits separated on different principal faces.

According to the fifth aspect above, the thickness of the present semiconductor device can be reduced.

According to the sixth aspect above, the integrated circuits formed on the semiconductor chip are exposed, thus making it easier to connect wires to the integrated circuits for internal connection purposes.

According to the seventh aspect above, the connection members are connected to faces which are oriented in the same direction, so that the conductive portions can be easily connected to the integrated circuits by means of wires.

According to the eighth aspect above, the non-conductive layer serves as a mount, whereby the number of component elements can be reduced.

According to the tenth aspect above, the conductive portion is formed by plating, and as such, the conductive portion can be produced inexpensively and cheaply.

According to the eleventh aspect above, a protrusion from the non-conductive layer functions as the conductive portion, which is the close vicinity of the non-conductive layer itself. As a result, the distances between the integrated circuits on the semiconductor chips and the conductive portion can be reduced.

According to the twelfth aspect above, the conductive portion is disposed on abridge. The bridge, which is constructed so as to connect the plurality of supporting legs to one another, can have various shapes. This also introduces a greater variety for the disposition of the conductive portion.

According to the thirteenth aspect above, the conductive portion is composed of an embedded conductive piece. Therefore, the conductive portion is free from fluctuations which would result from a plating process, thereby providing for a better connectability between the first semiconductor chip and the second semiconductor chip.

According to the fourteenth aspect above, the first connection member and the second connection member are composed of conductive pieces embedded in apertures, so that these two connection members do not extend outside the semiconductor chips. As a result, the present semiconductor device can be made more compact than in the case where the first connection member and the second connection member are composed of wires or the like.

According to the seventeenth aspect above, the first connection member and the second connection member are composed of conductive pieces embedded in apertures, so that these two connection members do not extend outside the semiconductor chips. As a result, the present semiconductor device can be made more compact than in the case where the first connection member and the second connection member are composed of wires or the like. The circuit provided on the non-conductive layer allows the first semiconductor chip to be internally connected to the second semiconductor chip even in the case where the first connection member and the second connection member are formed in distant positions.

According to the eighteenth aspect above, the integrated circuits on the semiconductor devices can be internally connected to each other even in the case where they are formed on faces that are oriented in the same direction.

According to the nineteenth aspect above, the integrated circuits on the semiconductor devices can be internally connected to each other even in the case where they are formed on faces that are oriented in the same direction.

According to the twentieth aspect above, the two semiconductor chips can be internally connected to each other even in the case where the non-conductive layer is disposed underneath the two semiconductor chips.

According to the twenty-first aspect above, the conductive portion is provided on a terminal for connecting the integrated circuits to an external circuit. Therefore, the positioning of the conductive portion can be finalized as the positioning of this terminal is set. Since the conductive portion is made integral with the terminal, the number of component elements can be reduced.

These and other objects, features, aspects and advantages of the present invention will become more apparent from the following detailed description of the present invention when taken in conjunction with the accompanying drawings.

DESCRIPTION OF THE PREFERRED EMBODIMENTS

A semiconductor device according to each embodiment of the present invention includes a plurality of bear semiconductor chips which are preferably encased in a common package. Each bear semiconductor chip has an integrated circuit formed on one of the two principal faces thereof (hereinafter, such a principal face of each semiconductor chip will be referred to as a "circuit face"). The circuit face of each semiconductor chip is internally connected to the circuit face(s) of the other semiconductor chip(s). As used herein, when a plurality of semiconductor chips composing a semiconductor device are said to be "internally connected" to one another, it is meant that the integrated circuits of the respective semiconductor chips are interconnected, within the semiconductor device, so that the integrated circuits can work in cooperation. Each of the embodiments below illustrates a semiconductor device incorporating such a plurality of semiconductor chips internally connected to one another.

(First Embodiment)

A semiconductor device according to a first embodiment of the present invention will be described with reference to FIGS. 1A, 1B, 1C, and FIG. 2.

Figure 1A:
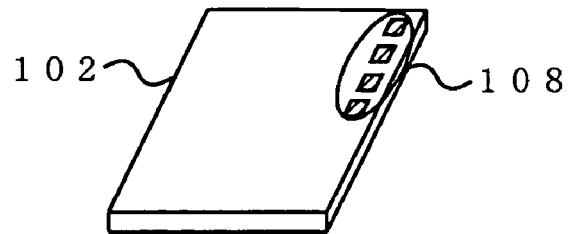
FIGS. 1A, 1B, and 1C are perspective views showing the outer appearance of component elements used in a semiconductor device according to a first embodiment of the present invention.
Figure 1B:
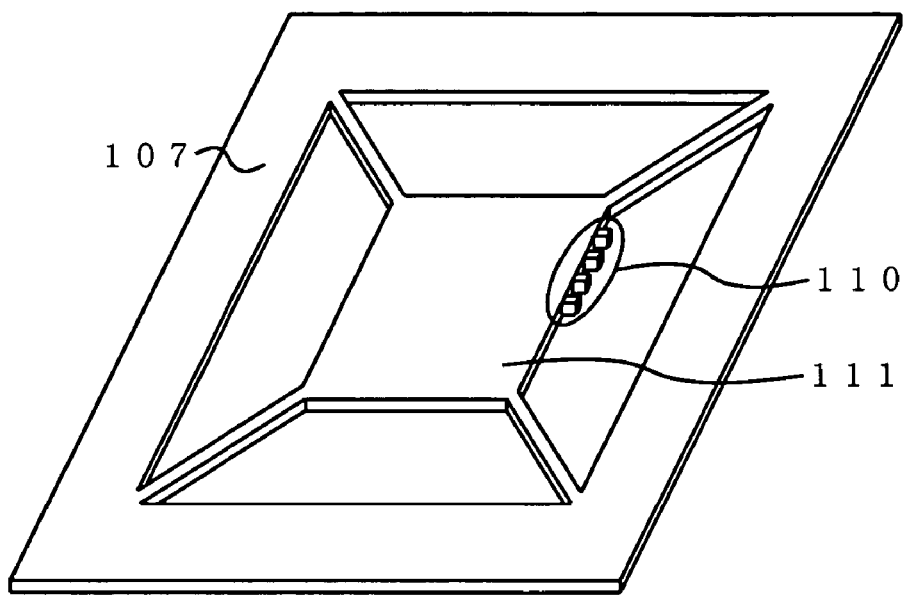
Figure 1C:
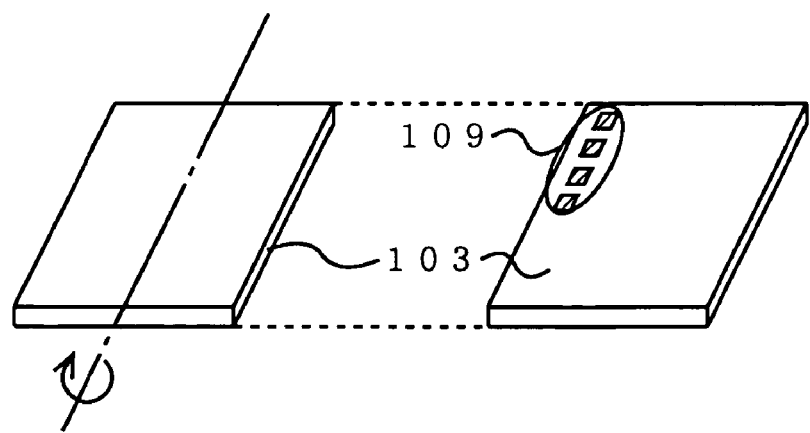

FIGS. 1A, 1B, and 1C are perspective views showing the outer appearance of component elements used in the semiconductor device according to the first embodiment of the present invention. FIG. 1A shows a first semiconductor chip 102. FIG. 1B shows a die pad 107. FIG. 1C shows a second semiconductor chip 103, with a front face being shown in the left-hand view, and a back face shown in the right-hand view. The semiconductor device according to the present embodiment is constructed by attaching the first semiconductor chip 102 shown in FIG. 1A, the die pad 107 shown in FIG. 1B, and the second semiconductor chip 103 shown in FIG. 1C to one another. Hereinafter, each component element will be described in detail.

The first semiconductor chip 102 includes circuitry formed on a face shown upwards in FIG. 1A, and includes connection pads 108 formed on this circuit face. The connection pads 108 are used for external connection or for connection with the second semiconductor chip 103. The die pad 107 serves as a non-conductive mount on which to place the first semiconductor chip 102 and the second semiconductor chip 103. The die pad 107 includes a non-conductive mount portion 111 and conductive connection members 110 formed on the mount portion 111. The mount portion 111 has substantially the same outer contour as that of the first semiconductor chip 102 and the second semiconductor chip 103. The first semiconductor chip 102 is to be attached to the face of the mount portion 111 shown upwards in FIG. 1B, and the second semiconductor chip 103 is to be attached to the opposite face of the mount portion 111. The conductive connection members 110 can be obtained by plating protrusions which are formed on a non-conductive piece composing the mount portion 111. The second semiconductor chip 103 has substantially the same size as that of the first semiconductor chip 102. The second semiconductor chip 103 includes circuitry formed on its back face shown in the right-hand view of FIG. 1C, and includes connection pads 109 formed on this circuit face. The connection pads 109 are used for external connection or for connection with the first semiconductor chip 102.

Figure 2:
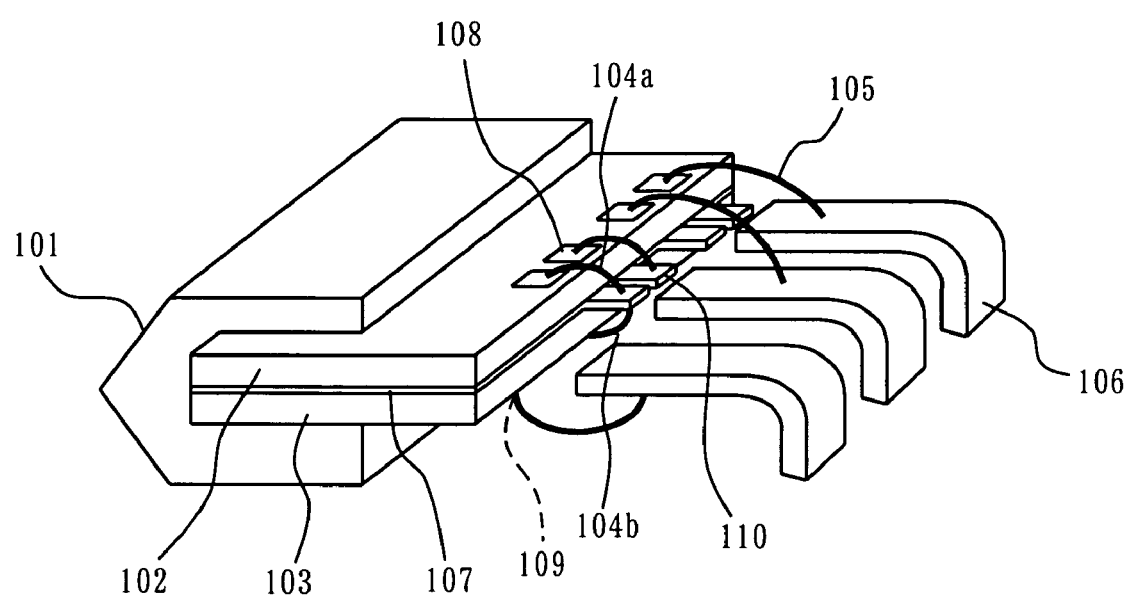
FIG. 2 is a partially-cutaway perspective view showing the outer appearance of the semiconductor device according to the first embodiment of the present invention.

Now, the structure of the semiconductor device according to the present embodiment will be described. FIG. 2 is a partially-cutaway perspective view showing the outer appearance of the semiconductor device according to the first embodiment of the present invention.

As shown in FIG. 2, the semiconductor device according to the present embodiment comprises a package 101, the first semiconductor chip 102 shown in FIG. 1A, the second semiconductor chip 103 shown in FIG. 1C, inter-chip connection wires 104a and 104b, external connection wires 105, external leads 106, and the die pad 107 shown in FIG. 1B. In FIG. 2, the outer framework of the die pad 107 (FIG. 1B) is omitted from illustration because the framework is to be cut off after the semiconductor device is sealed with the package 101. Moreover, FIG. 2 is partially cutaway such that a portion of the package 101 is omitted to reveal the vicinity of the connection members 110.

The package 101 is a case for protecting the first semiconductor chip 102 and the like. The inter-chip connection wires 104a are conductive wires for connecting the connection pads 108 of the first semiconductor chip 102 to the respective connection members 110. The inter-chip connection wires 104b are conductive wires for connecting the connection pads 109 of the second semiconductor chip 103 to the respective connection members 110. The external connection wires 105 are conductive wires for connecting the first semiconductor chip 102 or the second semiconductor chip 103 to the respective external leads 106. The external leads 106 are leads for connecting the present semiconductor device to an external device. The connection members 110 are conductive portions obtained by plating protrusions which are formed on the die pad 107, and realize connection between the first semiconductor chip 102 and the second semiconductor chip 103.

Next, the internal connection between the first semiconductor chip 102 and the second semiconductor chip 103 in the semiconductor device having the above-described structure will be described.

The first semiconductor chip 102 is attached to a front face of the mount portion 111 of the die pad 107 so that its circuit face faces upwards in FIG. 1A, 1B, or 1C. The second semiconductor chip 103 is attached to a back face of the mount portion 111 of the die pad 107 so that its circuit face faces downwards in FIG. 1A, 1B, or 1C. In other words, the first semiconductor chip 102 and the second semiconductor chip 103 are attached to the die pad 107 "back-to-back", i.e., so that their respective circuit faces face away from each other.

In order to internally connect the first semiconductor chip 102 and the second semiconductor chip 103 within the present semiconductor device, the connection pads 108 of the first semiconductor chip 102 and the respective connection members 110 are interconnected by the inter-chip connection wires 104a. Preferably, each inter-chip connection wire 104a is connected to a face of a corresponding connection member 110 that is oriented in the same direction as the circuit face of the first semiconductor chip 102.

Furthermore, the connection members 110 and the respective connection pads 109 of the second semiconductor chip 103 are interconnected by the inter-chip connection wires 104b. Preferably, each inter-chip connection wire 104b is connected to a face of a corresponding connection member 110 that is oriented in the same direction as the circuit face of the second semiconductor chip 103. Thus, the first semiconductor chip 102 and the second semiconductor chip 103 are internally connected via the connection members 110.

Thus, in accordance with the semiconductor device of the present embodiment, the connection members 110 which realize internal connection between the first semiconductor chip 102 and the second semiconductor chip 103 are provided on the mount portion 111 of the die pad 107. Therefore, it is unnecessary to employ any additional support member in order to introduce the connection members 110. As a result, the number of component elements in the present semiconductor device can be reduced.

Furthermore, since the connection members 110 are provided on the mount portion 111, the positioning between the connection members 110 and the connection pads 108 and 109 can be finalized at the time of producing the die pad 107. This makes it unnecessary to pay further attention to such positioning during the assembly of the semiconductor device itself.

Moreover, the internal connection between the connection pads 108 on the first semiconductor chip 102 and the connection pads 109 on the second semiconductor chip 103 can be established without involving the external leads 106. As a result, influences of surge are minimized.

Furthermore, in a preferred arrangement where each inter-chip connection wire 104a is connected to a face of a corresponding connection member 110 that is oriented in the same direction as the circuit face of the first semiconductor chip 102 and each inter-chip connection wire 104b is connected to a face of a corresponding connection member 110 that is oriented in the same direction as the circuit face of the second semiconductor chip 103, the process of connecting the respective wires can be facilitated.

Although the connection members 110 of the semiconductor device according to the present embodiment are illustrated as protrusions, the shape of the connection members 110 is not limited thereto.

Although the present embodiment illustrates an example where the non-conductive piece to be interposed between the first semiconductor chip 102 and the second semiconductor chip 103 is a die pad 107, the non-conductive piece is not limited to a die pad 107. Specifically, as shown in FIG. 3B, the non-conductive piece may be a mere non-conductive piece which has connection members 121 (conductive portions) formed thereon and has substantially the same size as that of the first semiconductor chip 102 and the second semiconductor chip 103. In this case, the first semiconductor chip 102, the non-conductive piece 120, and the second semiconductor chip 103 are stacked in this order, and the first semiconductor chip 102 and the second semiconductor chip 103 are interconnected with wires via the connection member 121. In this manner, a semiconductor assembly is obtained which includes the first and second semiconductor chips 102 and 103 internally connected to one another. The semiconductor assembly thus obtained may be disposed on a die pad and connected to external leads, whereby a semiconductor device with a similar performance to that of the semiconductor device shown in FIG. 2 can be obtained.

Figure 3A:
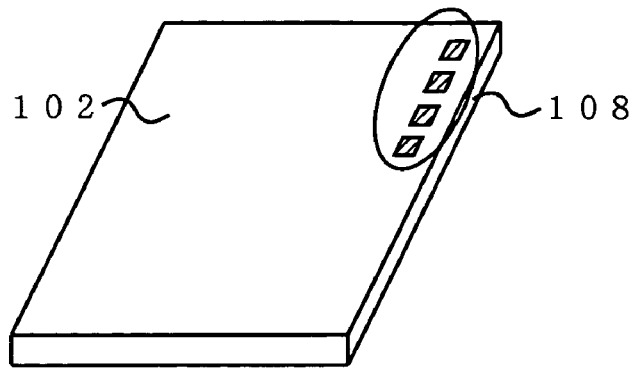
FIGS. 3A, 3B, and 3C are perspective views showing the outer appearance of component elements used in a semiconductor assembly according to the to the first embodiment of the present invention.
Figure 3B:
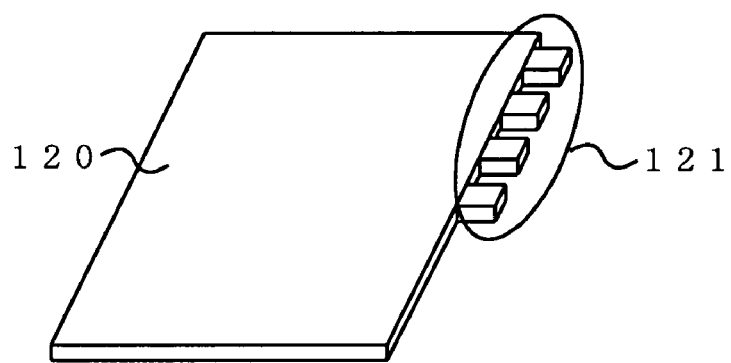
Figure 3C:
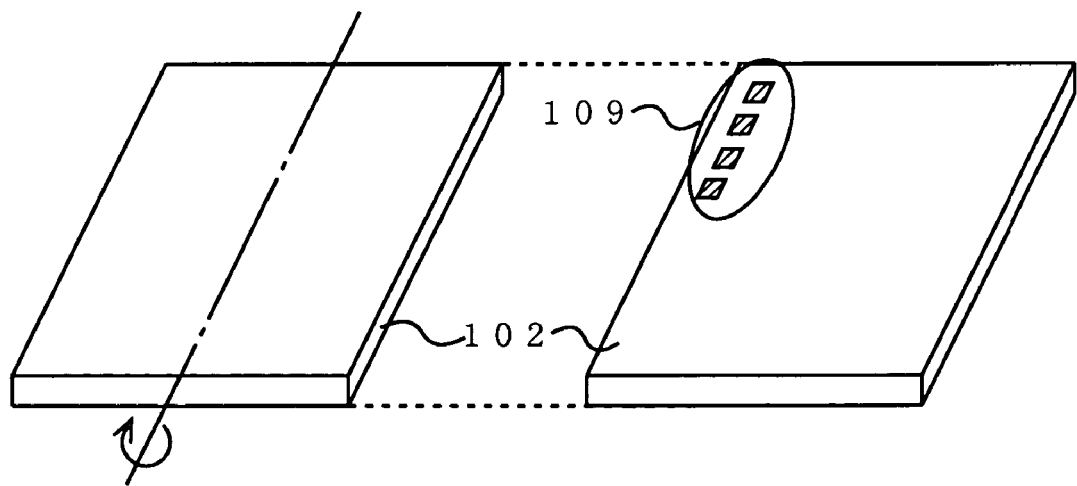

By employing a semiconductor assembly based on the non-conductive piece 120 as shown in FIGS. 3A to 3C, the first semiconductor chip 102 and the second semiconductor chip 103 are first attached to each other and then affixed to a die pad. This provides more liberty in the designing of a device which incorporates such a semiconductor assembly.

(Second Embodiment)

A semiconductor device according to a second embodiment of the present invention will be described with reference to FIGS. 4A, 4B, 4C, and FIG. 5.

Figure 4A:
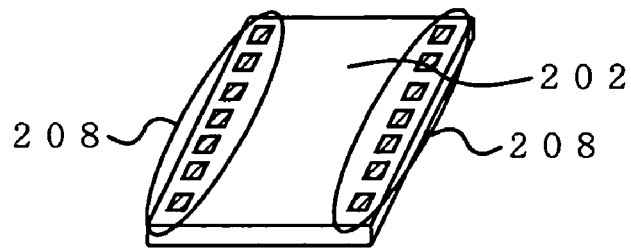
FIGS. 4A, 4B, and 4C are perspective views showing the outer appearance of component elements used in a semiconductor device according to a second embodiment of the present invention.
Figure 4B:
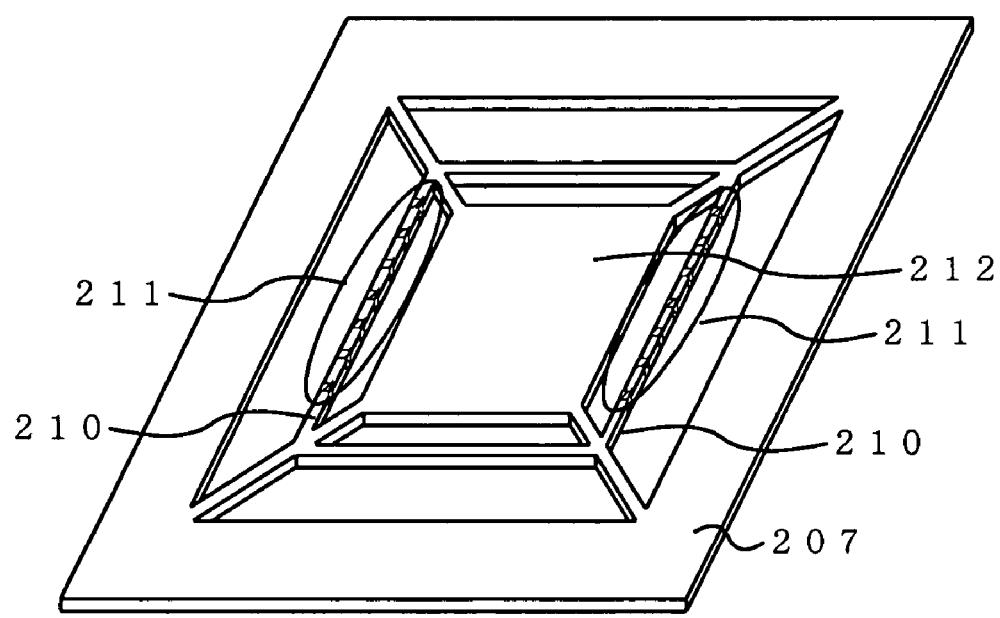
Figure 4C:
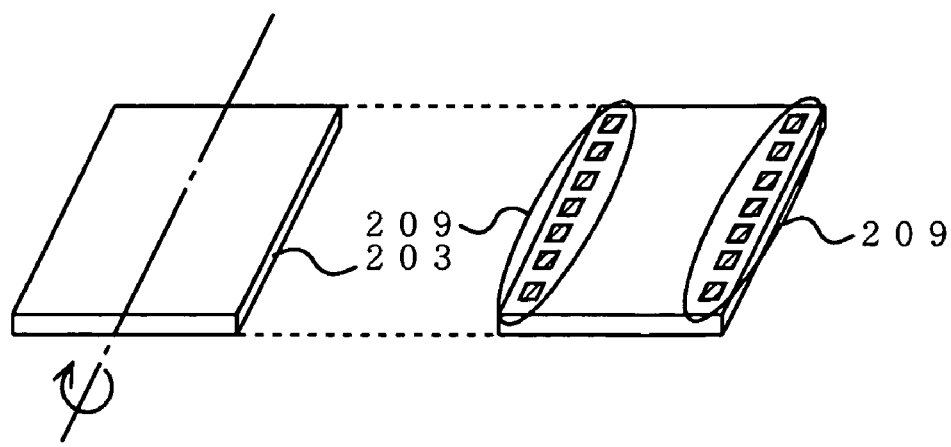

FIGS. 4A, 4B, and 4C are perspective views showing the outer appearance of component elements used in the semiconductor device according to the second embodiment of the present invention. FIG. 4A shows a first semiconductor chip 202. FIG. 4B shows a die pad 207. FIG. 4C shows a second semiconductor chip 203, with a front face being shown in the left-hand view, and a back face shown in the right-hand view. The semiconductor device according to the present embodiment is constructed by attaching the first semiconductor chip 202 shown in FIG. 4A, the die pad 207 shown in FIG. 4B, and the second semiconductor chip 203 shown in FIG. 4C to one another. Hereinafter, each component element will be described in detail.

The first semiconductor chip 202 and the second semiconductor chip 203 are identical to the first semiconductor chip 102 and the second semiconductor chip 103 according to the first embodiment, and the descriptions thereof are omitted. The die pad 207 serves as a non-conductive mount on which to place the first semiconductor chip 202 and the second semiconductor chip 203. The die pad 207 includes a non-conductive mount portion 212 and a bridge 210. The mount portion 212 is similar to the mount portion 111 according to the first embodiment, and the description thereof is omitted. The bridge 210 includes conductive connection members 211 formed thereon, which can be obtained by plating portions of the bridge 210.

Figure 5:
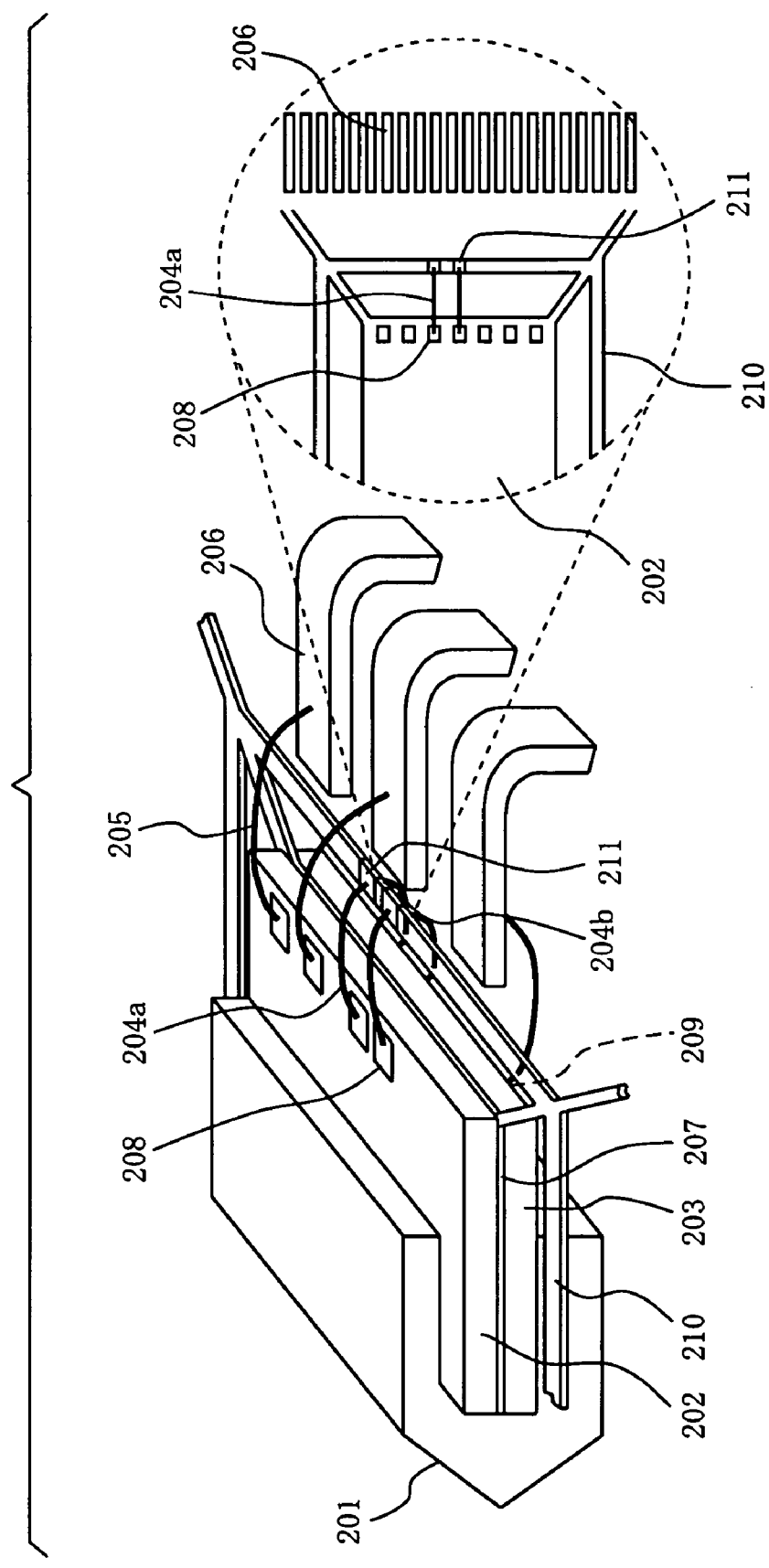
FIG. 5 is a partially-cutaway perspective view showing the outer appearance of the semiconductor device according to the second embodiment of the present invention.

Now, the structure of the semiconductor device according to the present embodiment will be described. FIG. 5 is a partially-cutaway perspective view showing the outer appearance of the semiconductor device according to the second embodiment of the present invention.

As shown in FIG. 5, the semiconductor device according to the present embodiment comprises a package 201, the first semiconductor chip 202, the second semiconductor chip 203, inter-chip connection wires 204a and 204b, external connection wires 205, external leads 206, and the die pad 207. In FIG. 5, the outer framework of the die pad 207 and a portion of the package 201 is omitted from illustration for the reasons described in the first embodiment.

The package 201, the first semiconductor chip 202, the second semiconductor chip 203, the inter-chip connection wires 204a and 204b, the external connection wires 205, the external leads 206, the connection pads 208, and the connection pads 209 are similar to those in the first embodiment, and the descriptions thereof are omitted.

The die pad 207, which serves as a mount on which to place the semiconductor chips 202 and 203 (as does the die pad 107 according to the first embodiment), includes the bridge 210. The bridge 210 is formed so as to interconnect the four legs which connect the mount portion 212 and the outer framework. The connection members 211, which are conductive portions formed on the bridge 210, realize internal connection between the first semiconductor chip 202 and the second semiconductor chip 203.

Next, the internal connection between the first semiconductor chip 202 and the second semiconductor chip 203 in the semiconductor device having the above-described structure will be described.

The first semiconductor chip 202 is attached to a front face of the mount portion 212 of the die pad 207 so that its circuit face faces upwards in FIG. 4A, 4B, or 4C. The second semiconductor chip 203 is attached to a back face of the mount portion 212 of the die pad 207 so that its circuit face faces downwards in FIG. 4A, 4B, or 4C. In other words, the first semiconductor chip 202 and the second semiconductor chip 203 are attached to the die pad 207 "back-to-back", i.e., so that their respective circuit faces face away from each other.

In order to internally connect the first semiconductor chip 202 and the second semiconductor chip 203 within the present semiconductor device, the connection pads 208 of the first semiconductor chip 202 and the respective connection members 211 are interconnected by the inter-chip connection wires 204a. Preferably, each inter-chip connection wire 204a is connected to a face of a corresponding connection member 211 that is oriented in the same direction as the circuit face of the first semiconductor chip 202.

Furthermore, the connection members 211 and the respective connection pads 209 of the second semiconductor chip 203 are interconnected by the inter-chip connection wires 204b. Preferably, each inter-chip connection wire 204b is connected to a face of a corresponding connection member 211 that is oriented in the same direction as the circuit face of the second semiconductor chip 203. Thus, the first semiconductor chip 202 and the second semiconductor chip 203 are internally connected via the connection members 211.

Thus, in accordance with the semiconductor device of the present embodiment, the connection members 211 which realize internal connection between the first semiconductor chip 202 and the second semiconductor chip 203 are provided on the bridge 210, which is a part of the die pad 207. Therefore, it is unnecessary to employ any additional support member in order to introduce the connection members 211. As a result, the number of component elements in the present semiconductor device can be reduced.

Furthermore, since the connection members 211 are provided on the bridge 210, the positioning between the connection members 211 and the connection pads 208 and 209 can be finalized at the time of producing the die pad 207. This makes it unnecessary to pay further attention to such positioning during the assembly of the semiconductor device itself, as in the case of the first embodiment.

Moreover, the internal connection between the first semiconductor chip 202 and the second semiconductor chip 203 can be established without involving the external leads 206. As a result, influences of surge are minimized.

Furthermore, the process of connecting the respective wires can be facilitated in a preferred arrangement as described in the first embodiment.

Furthermore, in accordance with the semiconductor device of the present embodiment, the inter-chip connection based on the connection between the connection members 211 on the bridge 210 and the inter-chip connection wires 204a and 204b allows for a lot of liberty.

The semiconductor device according to the present embodiment may also be produced from a semiconductor assembly as described in the first embodiment.

(Third Embodiment)

A semiconductor device according to a third embodiment of the present invention will be described with reference to FIGS. 6A, 6B, 6C, and FIG. 7.

Figure 6A:
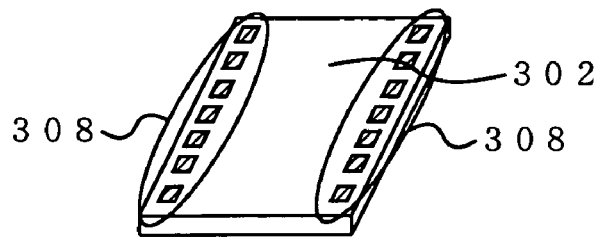
FIGS. 6A, 6B, and 6C are perspective views showing the outer appearance of component elements used in a semiconductor device according to a third embodiment of the present invention.
Figure 6B:
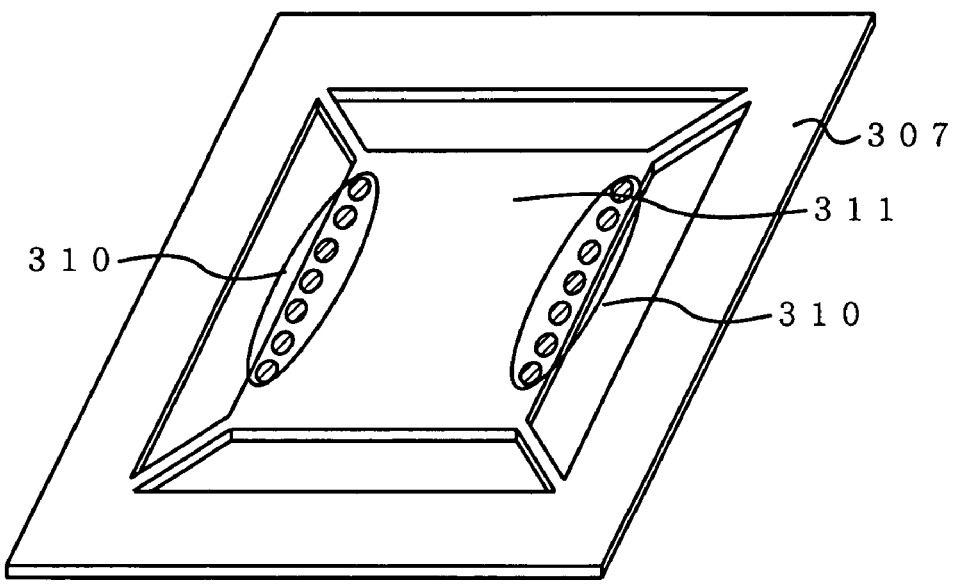
Figure 6C:
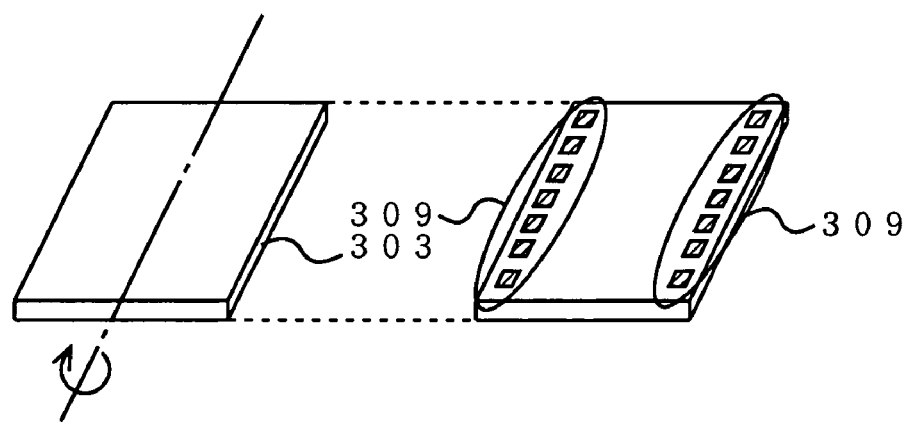

FIGS. 6A, 6B, and 6C are perspective views showing the outer appearance of component elements used in the semiconductor device according to the second embodiment of the present invention. FIG. 6A shows a first semiconductor chip 302. FIG. 6B shows a die pad 307. FIG. 6C shows a second semiconductor chip 303, with a front face being shown in the left-hand view, and a back face shown in the right-hand view. The semiconductor device according to the present embodiment is constructed by attaching the first semiconductor chip 302 shown in FIG. 6A, the die pad 307 shown in FIG. 6B, and the second semiconductor chip 303 shown in FIG. 6C to one another. Hereinafter, each component element will be described in detail.

The first semiconductor chip 302 and the second semiconductor chip 303 are identical to the first semiconductor chip 102 and the second semiconductor chip 103 according to the first embodiment, and the descriptions thereof are omitted.

The die pad 307 serves as a non-conductive mount on which to place the first semiconductor chip 302 and the second semiconductor chip 303. As shown in FIG. 6B, the die pad 307 includes a mount portion 311 on which to place the first semiconductor chip 302 and the second semiconductor chip 303, the mount portion 311 being larger than the mount portions according to the first and second embodiments. Connection members 310 are provided near edges of the mount portion 311. Specifically, the connection members 310 are formed by making holes near edges of the mount portion 311, and placing metal pieces in the holes.

Figure 7:
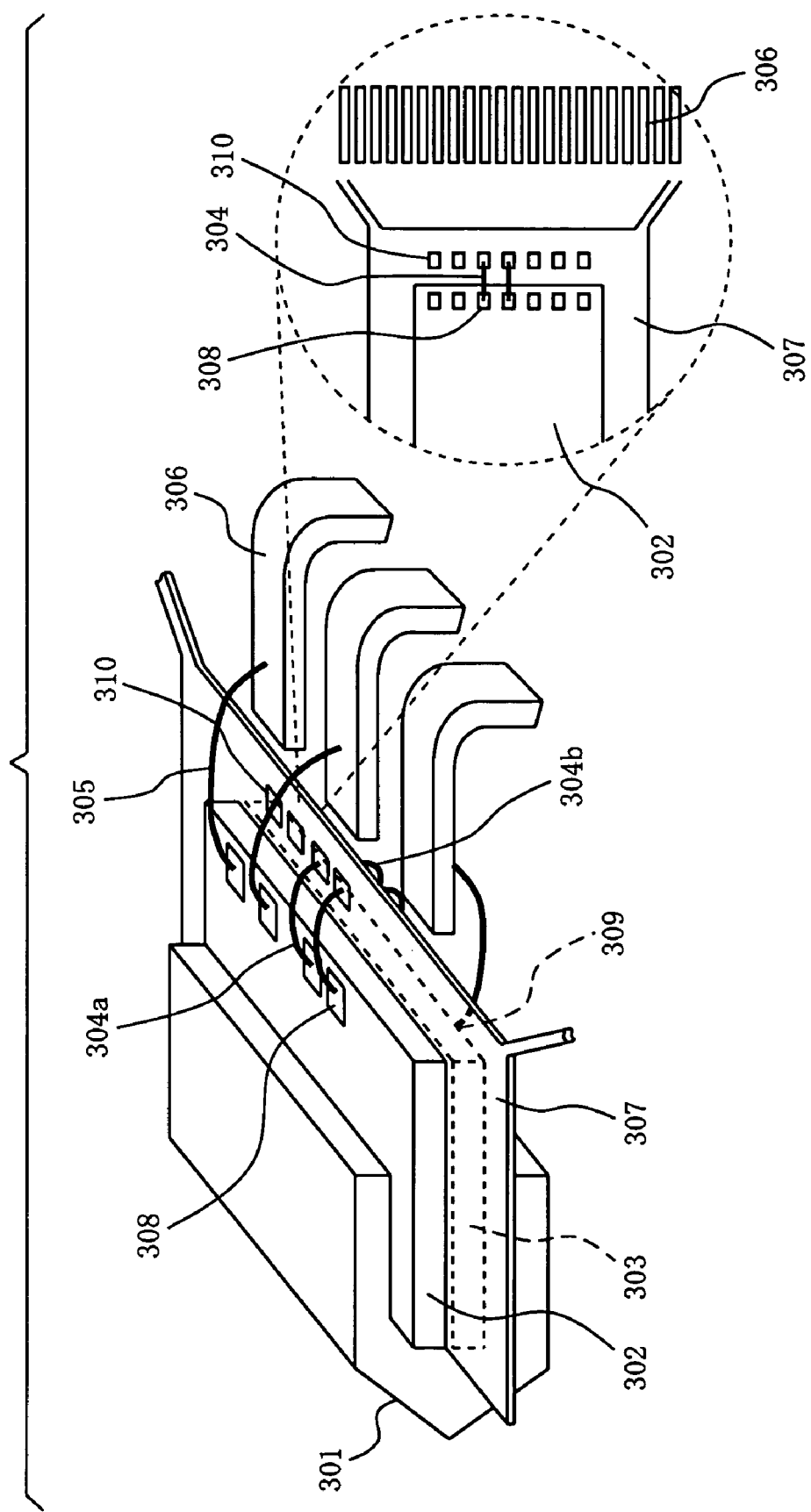
FIG. 7 is a partially-cutaway perspective view showing the outer appearance of the semiconductor device according to the third embodiment of the present invention.

Now, the structure of the semiconductor device according to the present embodiment will be described. FIG. 7 is a partially-cutaway perspective view showing the outer appearance of the semiconductor device according to the second embodiment of the present invention.

As shown in FIG. 7, the semiconductor device according to the present embodiment comprises a package 301, the first semiconductor chip 302, the second semiconductor chip 303, inter-chip connection wires 304a and 304b, external connection wires 305, external leads 306, and the die pad 307. In FIG. 7, the outer framework of the die pad 307 and a portion of the package 301 is omitted from illustration for the reasons described in the first embodiment.

The package 301, the first semiconductor chip 302, the second semiconductor chip 303, the inter-chip connection wires 304a and 304b, the external connection wires 305, the external leads 306, the connection pads 308, and the connection pads 309 are similar to those in the first embodiment, and the descriptions thereof are omitted.

The die pad 307, which serves as a mount on which to place the semiconductor chips 302 and 303 (as does the die pad 107 according to the first embodiment), includes the connection members 310. The first semiconductor chip 302 and the second semiconductor chip 303 are attached to the die pad 307 in such a manner that the connection members 310 lie outside of the first semiconductor chip 302 and the second semiconductor chip 303. The connection members 310 realize internal connection between the first semiconductor chip 302 and the second semiconductor chip 303 as in the first embodiment.

Next, the internal connection between the first semiconductor chip 302 and the second semiconductor chip 303 in the semiconductor device having the above-described structure will be described.

The first semiconductor chip 302 is attached to a front face of the mount portion 311 of the die pad 307 so that its circuit face faces upwards in FIG. 6A, 6B, or 6C. The second semiconductor chip 303 is attached to a back face of the mount portion 311 of the die pad 307 so that its circuit face faces downwards in FIG. 6A, 6B, or 6C. In other words, the first semiconductor chip 302 and the second semiconductor chip 303 are attached to the die pad 307 "back-to-back", i.e., so that their respective circuit faces face away from each other.

In order to internally connect the first semiconductor chip 302 and the second semiconductor chip 303 within the present semiconductor device, the connection pads 308 of the first semiconductor chip 302 and the respective connection members 310 are interconnected by the inter-chip connection wires 304a. Preferably, each inter-chip connection wire 304a is connected to a face of a corresponding connection member 310 that is oriented in the same direction as the circuit face of the first semiconductor chip 302.

Furthermore, the connection members 310 and the respective connection pads 309 of the second semiconductor chip 303 are interconnected by the inter-chip connection wires 304b. Preferably, each inter-chip connection wire 304b is connected to a face of a corresponding connection member 310 that is oriented in the same direction as the circuit face of the second semiconductor chip 303. Thus, the first semiconductor chip 302 and the second semiconductor chip 303 are internally connected via the connection members 310.

Thus, in accordance with the semiconductor device of the present embodiment, the connection members 310 which realize internal connection between the first semiconductor chip 302 and the second semiconductor chip 303 are provided on the die pad 307. Therefore, it is unnecessary to employ any additional support member in order to introduce the connection members 310. As a result, the number of component elements in the present semiconductor device can be reduced.

Furthermore, since the connection members 310 are provided on the die pad 307, the positioning between the connection members 310 and the connection pads 308 and 309 can be finalized at the time of producing the die pad 307. This makes it unnecessary to pay further attention to such positioning during the assembly of the semiconductor device itself, as in the case of the first embodiment.

Moreover, the internal connection between the first semiconductor chip 302 and the second semiconductor chip 303 can be established without involving the external leads 306. As a result, influences of surge are minimized.

Furthermore, the process of connecting the respective wires can be facilitated in a preferred arrangement as described in the first embodiment.

As described above, the connection members 310 according to the present embodiment are composed of metal pieces placed in holes formed in the die pad 307. As such, the connection members 310 are free from fluctuations which would result from a plating process, thereby providing for a better connectability with the wires.

The semiconductor device according to the present embodiment may also be produced from a semiconductor assembly as described in the first embodiment.

Although the first to third embodiments above each illustrate an example where connection members for realizing internal connection between the first semiconductor chip and the second semiconductor chip are provided on a die pad, such connection members may be provided on any element other than the die pad. As a fourth embodiment, an example of such a semiconductor device will be described below.

(Fourth Embodiment)

A semiconductor device according to a fourth embodiment of the present invention will be described with reference to FIG. 8.

Figure 8:
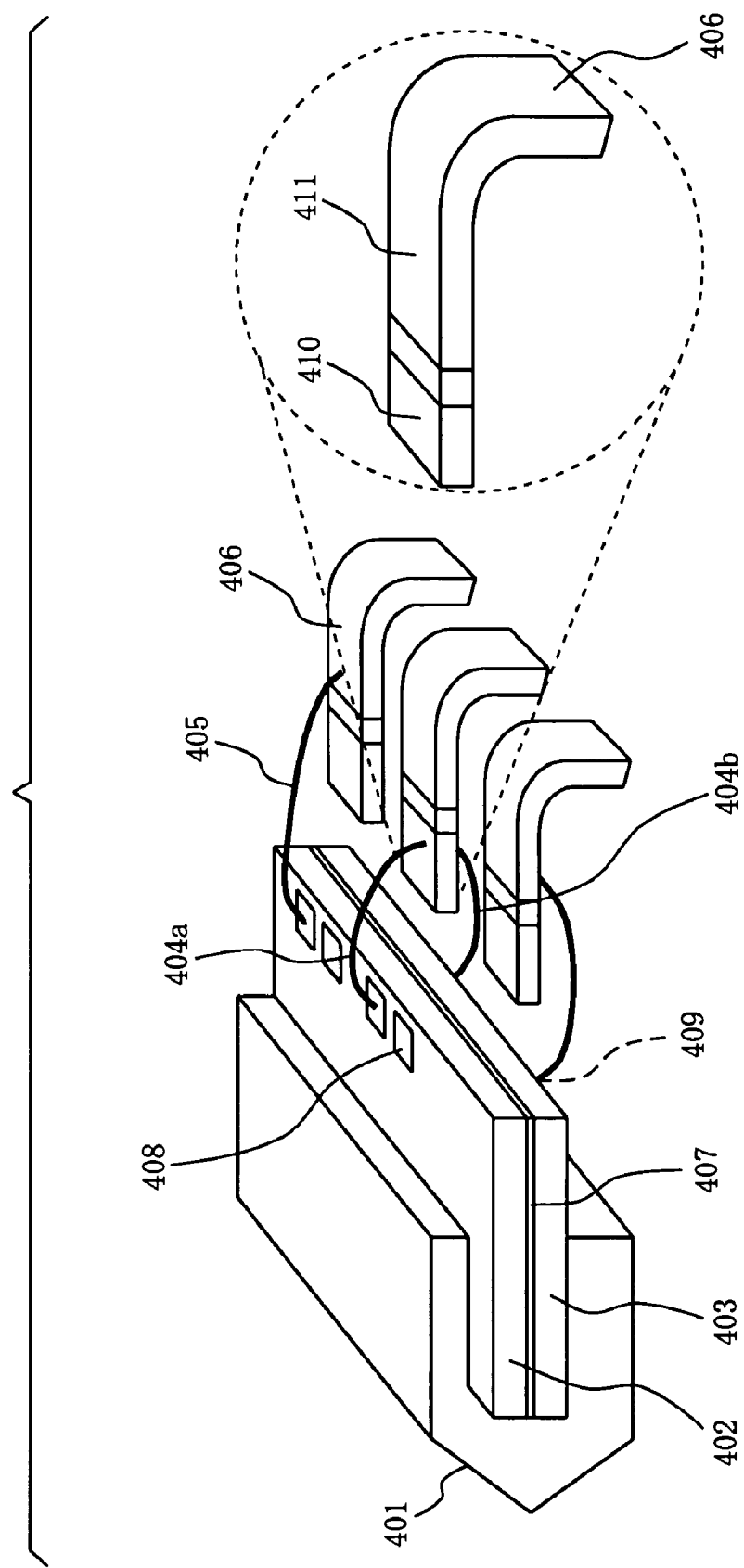
FIG. 8 is a partially-cutaway perspective view showing the outer appearance of a semiconductor device according to a fourth embodiment of the present invention.

FIG. 8 is a partially-cutaway perspective view showing the outer appearance of a semiconductor device according to the present embodiment of the present invention. The semiconductor device according to the present embodiment comprises a package 401, a first semiconductor chip 402, a second semiconductor chip 403, inter-chip connection wires 404a and 404b, external connection wires 405, external leads 406, and a die pad 407.

The package 401, the inter-chip connection wires 404a and 404b, and the external connection wires 405 are identical to those in the first embodiment, and the descriptions thereof are omitted. As is the case with the first semiconductor chip 102 according to the first embodiment, the first semiconductor chip 402 includes circuitry formed on one face, and includes connection pads 408 formed on this circuit face. Similarly, as is the case with the second semiconductor chip 103 according to the first embodiment, the second semiconductor chip 403 includes circuitry formed on one face, and includes connection pads 409 formed on this circuit face.

The external leads 406 according to the present embodiment will be described. Each external lead 406 according to the present embodiment is composed of a non-conductive piece having a similar shape to that of the external leads 106 according to the first embodiment. A portion of the external lead 406 lying closer to the semiconductor device is plated to become a connection member 410 for realizing internal connection between the first semiconductor chip 402 and the second semiconductor chip 403. Another portion of the external lead 406 is also plated to become an external connection member 411 for connecting the present semiconductor device to an external device. As shown in FIG. 8, the connection member 410 of each external lead 406 is insulated from the external connection member 411 by a non-conductive portion.

Next, the internal connection between the first semiconductor chip 402 and the second semiconductor chip 403 in the semiconductor device having the above-described structure will be described.

The first semiconductor chip 402 is attached to a front face of a mount portion of the die pad 407 so that its circuit face faces upwards in FIG. 8. The second semiconductor chip 403 is attached to a back face of the mount portion of the die pad 407 so that its circuit face faces downwards in FIG. 8. In other words, the first semiconductor chip 402 and the second semiconductor chip 403 are attached to the die pad 407 "back-to-back", i.e., so that their respective circuit faces face away from each other.

In order to internally connect the first semiconductor chip 402 and the second semiconductor chip 403 within the present semiconductor device, the connection pads 408 of the first semiconductor chip 402 and the respective connection members 410 are interconnected by the inter-chip connection wires 404a. Preferably, each inter-chip connection wire 404a is connected to a face of a corresponding connection member 410 that is oriented in the same direction as the circuit face of the first semiconductor chip 402.

Furthermore, the connection members 410 and the respective connection pads 409 of the second semiconductor chip 403 are interconnected by the inter-chip connection wires 404b. Preferably, each inter-chip connection wire 404b is connected to a face of a corresponding connection member 410 that is oriented in the same direction as the circuit face of the second semiconductor chip 403. Thus, the first semiconductor chip 402 and the second semiconductor chip 403 are internally connected via the connection members 410.

In accordance with the semiconductor device of the present embodiment, the connection members 410 and the external connection members 411 are formed by plating portions of the external leads 406, which themselves are composed of non-conductive pieces. In other words, the connection members 410 are integral parts of the external leads 406. Therefore, it is unnecessary to employ any additional support member in order to introduce the connection members 410. As a result, the number of component elements in the present semiconductor device can be reduced, as in the first embodiment.

In accordance with the semiconductor device of the present embodiment, positioning of the connection members 410 can be finalized during the positioning of the external leads 406. This makes it unnecessary to pay further attention to the positioning of the connection members 410 during the assembly of the semiconductor device itself.

Moreover, the internal connection between the first semiconductor chip 402 and the second semiconductor chip 403 can be established without involving the external leads 206. As a result, influences of surge are minimized.

Furthermore, the process of connecting the respective wires can be facilitated in a preferred arrangement as described in the first embodiment.

According to the present embodiment, there is no need to design a special shape for the lead frame itself.

According to the first to fourth embodiments, the first semiconductor chip and the second semiconductor chip are internally connected via connection members, so that the connection pads of the first semiconductor chip and the connection pads of the second semiconductor device need to be placed in the neighborhood of the connection members. Therefore, in the case where the connection pads of the first semiconductor chip are distant from the connection pads of the second semiconductor chip, it might be difficult to connect them according to the first to fourth embodiments.

As a fifth embodiment, a semiconductor device which allows the connection pads of the first semiconductor chip to be connected to the connection pads of the second semiconductor chip even in the case where the connection pads of the first semiconductor chip and the second semiconductor chip are in distant positions will be described below.

(Fifth Embodiment)

A semiconductor device according to a fifth embodiment of the present invention will be described with reference to FIGS. 9A, 9B, 9C, and FIG. 10.

Figure 9A:
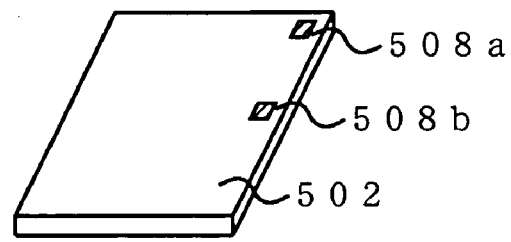
FIGS. 9A, 9B, and 9C are perspective views showing the outer appearance of component elements used in a semiconductor device according to a fifth embodiment of the present invention.
Figure 9B:
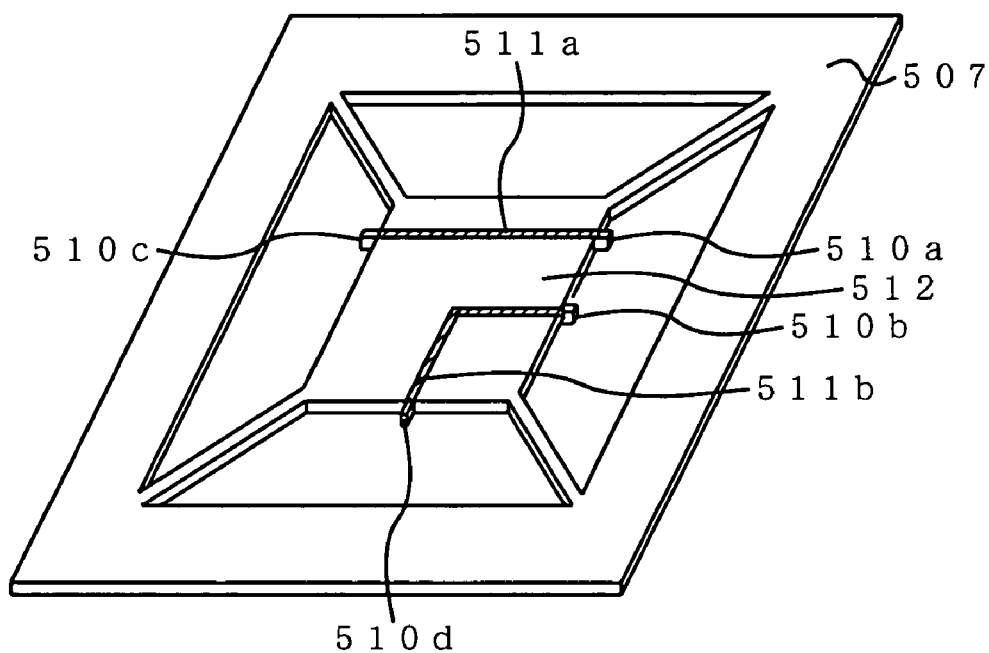
Figure 9C:
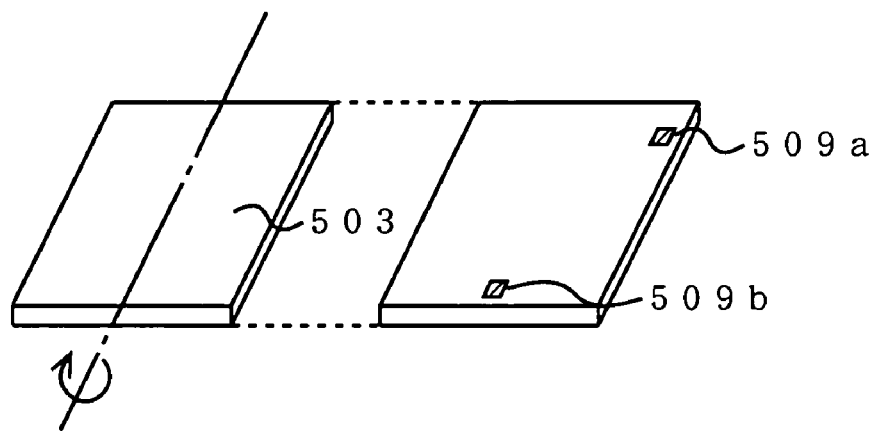

FIGS. 9A, 9B, and 9C are perspective views showing the outer appearance of component elements used in the semiconductor device according to the fifth embodiment of the present invention. FIG. 9A shows a first semiconductor chip 502. FIG. 9B shows a die pad 507. FIG. 9C shows a second semiconductor chip 503, with a front face being shown in the left-hand view, and a back face shown in the right-hand view. The semiconductor device according to the present embodiment is constructed by attaching the first semiconductor chip 502 shown in FIG. 9A, the die pad 507 shown in FIG. 9B, and the second semiconductor chip 503 shown in FIG. 9C to one another. Hereinafter, each component element will be described in detail.

The first semiconductor chip 502 is identical to the first semiconductor chip 102 in the first embodiment, and the description thereof is omitted.

As shown in FIG. 9C, the second semiconductor chip 503 includes connection pads 509a and 509b. The second semiconductor chip 503 of the present embodiment is different from the second semiconductor chip 103 of the first embodiment in that the connection pads 509a and 509b do not come in the neighborhoods of the connection pads 508a and 508b of the first semiconductor chip 502 when the first and second semiconductor chips 502 and 503 are stacked together.

The die pad 507 serves as a non-conductive mount on which to place the first semiconductor chip 502 and the second semiconductor chip 503, and includes a mount portion 512, connection members 510a, 510b, 510c, and 510d, and metal strips 511a and 511b. The connection members 510a to 510d and the metal strips 511a and 511b are formed on the mount portion 512, on which the first semiconductor chip 502 and the second semiconductor chip 503 are to be placed. The connection members 510a to 510d are obtained by plating protrusions which are formed on a non-conductive piece composing the mount portion 512. The connection member 510a is to be connected to the connection pad 508a of the first semiconductor chip 502. The connection member 510b is to be connected to the connection pad 508b of the first semiconductor chip 502. The connection member 510c is to be connected to the connection pad 509a of the second semiconductor chip 503. The connection member 510d is to be connected to the connection pad 509b of the second semiconductor chip 503.

The metal strip 511a, which is a strip for interconnecting the connection member 510a and the connection member 510c, may be obtained through plating. The metal strip 511b, which is a strip for interconnecting the connection member 510b and the connection member 510d, may be obtained through plating.

Figure 10:
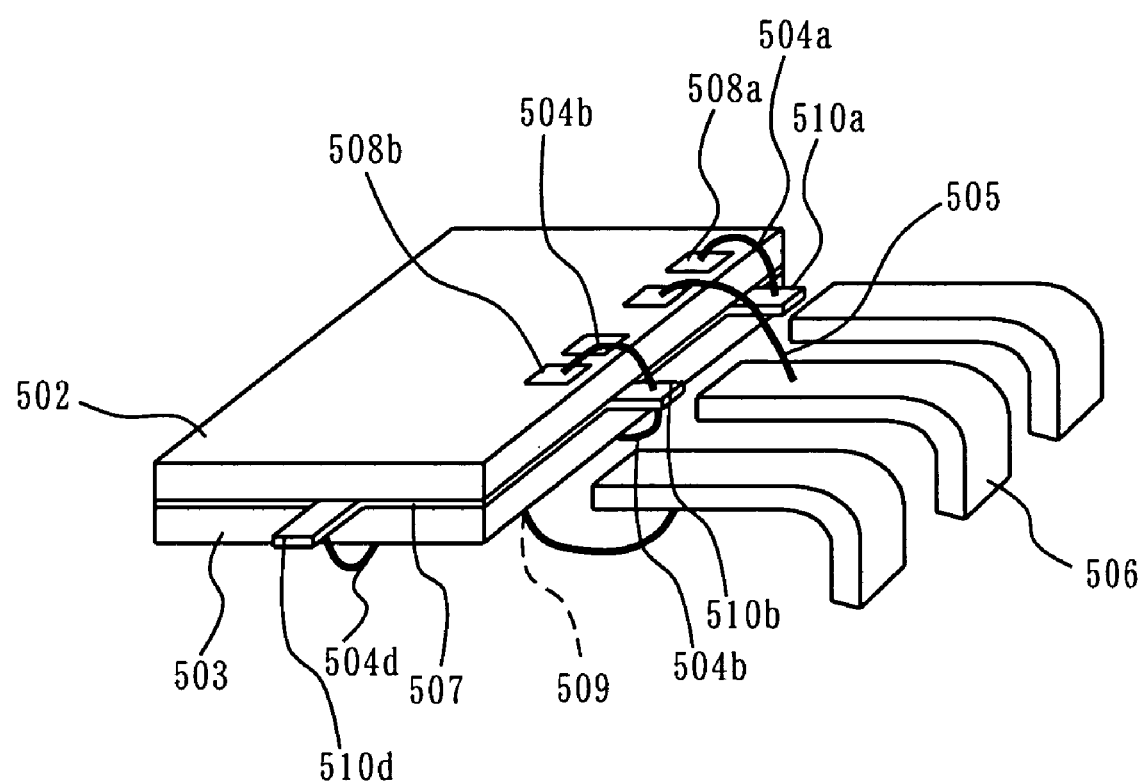
FIG. 10 is a perspective view showing the outer appearance of the semiconductor device according to the fifth embodiment of the present invention.

Now, the structure of the semiconductor device according to the present embodiment will be described. FIG. 10 is a perspective view showing the outer appearance of the semiconductor device according to the second embodiment of the present invention.

The semiconductor device according to the present embodiment comprises the first semiconductor chip 502, the second semiconductor chip 503, inter-chip connection wires 504a, 504b, 504c (not shown in FIG. 10), and 504d, external connection wires 505, external leads 506, and the die pad 507. In FIG. 10, a portion of the die pad 507 and a package are omitted from illustration.

The external connection wire 505 and the external leads 506 are similar to those in the first embodiment, and the descriptions thereof are omitted.

According to the present embodiment, the inter-chip connection wire 504a connects the connection pad 508a to the connection member 510a. The inter-chip connection wire 504b connects the connection pad 508b to the connection member 510b. The inter-chip connection wire 504c (not shown in FIG. 10) connects the connection pad 509a to the connection member 510c. The inter-chip connection wire 504d connects the connection pad 509b to the connection member 510d.

Next, the internal connection between the first semiconductor chip 502 and the second semiconductor chip 503 in the semiconductor device having the above-described structure will be described.

The first semiconductor chip 502 is attached to a front face of the mount portion 512 of the die pad 507 so that its circuit face faces upwards in FIG. 9A, 9B, or 9C. When the first semiconductor chip 502 and the die pad 507 are attached together, a non-conductive adhesive is used in order to prevent short-circuiting between the metal strips 511a and 511b and the first semiconductor chip 502.

The second semiconductor chip 503 is attached to a back face of the mount portion 512 of the die pad 507 so that its circuit face faces downwards in FIG. 9A, 9B, or 9C. In other words, the first semiconductor chip 502 and the second semiconductor chip 503 are attached to the die pad 507 "back-to-back", i.e., so that their respective circuit faces face away from each other.

In order to internally connect the first semiconductor chip 502 and the second semiconductor chip 503 within the present semiconductor device, the connection pad 508a of the first semiconductor chip 502 and the connection member 510a are interconnected by the inter-chip connection wire 504a. Furthermore, the connection member 510c and the connection pad 509a of the second semiconductor chip 503 are interconnected by the inter-chip connection wire 504c (not shown in FIG. 10). As a result, the connection pad 508a of the first semiconductor chip 502 is electrically connected to the connection pad 509a of the second semiconductor chip 503 via the connection member 510a, the metal strip 511a, and the connection pad 510c. Preferably, the inter-chip connection wire 504a is connected to a face of the connection member 510a that is oriented in the same direction as the circuit face of the first semiconductor chip 502. Preferably, the inter-chip connection wire 504c (not shown in FIG. 10) is connected to a face of the connection member 510c that is oriented in the same direction as the circuit face of the second semiconductor chip 503.

In order to internally connect the first semiconductor chip 502 and the second semiconductor chip 503 within the present semiconductor device, the connection pad 508b of the first semiconductor chip 502 and the connection member 510b are interconnected by the inter-chip connection wire 504b. Furthermore, the connection member 510d and the connection pad 509b of the second semiconductor chip 503 are interconnected by the inter-chip connection wire 504d. As a result, the connection pad 508b of the first semiconductor chip 502 is electrically connected to the connection pad 509b of the second semiconductor chip 503, via the connection member 510b, the metal strip 511b, and the connection pad 510d. Preferably, the inter-chip connection wire 504b is connected to a face of the connection member 510b that is oriented in the same direction as the circuit face of the first semiconductor chip 502. Preferably, the inter-chip connection wire 504d is connected to a face of the connection member 510d that is oriented in the same direction as the circuit face of the second semiconductor chip 503.

Thus, the present embodiment not only provides the effects attained by the first embodiment but also provides an advantage in that the metal strips formed on the die pad 507 allow the connection pads of the first semiconductor chip 502 to be connected to the connection pads of the second semiconductor chip 503 even in the case where the connection pads of the first semiconductor chip and the second semiconductor chip are in distant positions.

Although the present embodiment illustrates an example where the first semiconductor chip 502 and the die pad 507 are attached together by using a non-conductive adhesive in order to prevent short-circuiting between the metal strips 511a and 511b and the first semiconductor chip 502, any other means for ensuring isolation between the metal strips 511a and 511b on the die pad 507 and the first semiconductor chip 502 may be used. For example, a non-conductive film may be attached to a principle face of the mount portion 512 having the metal strips 511a and 511b formed thereon, and thereafter the first semiconductor chip 502 may be attached onto the non-conductive film. Instead of a non-conductive film, a plate composed of the same non-conductive material as that composing the die pad 507 may be attached to the mount portion 512 having the metal strips 511a and 511b formed thereon.

Figure 11A:
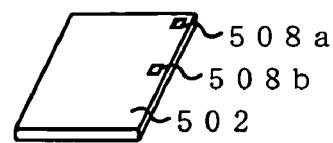
FIGS. 11A, 11B, and 11C are perspective views showing the outer appearance of component elements used in another semiconductor device according to the fifth embodiment of the present invention.
Figure 11B:
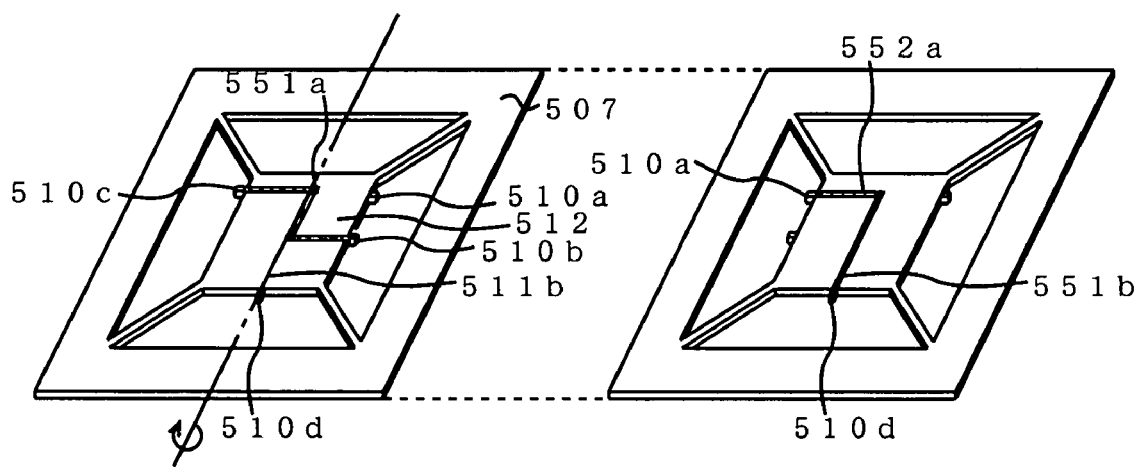
Figure 11C:
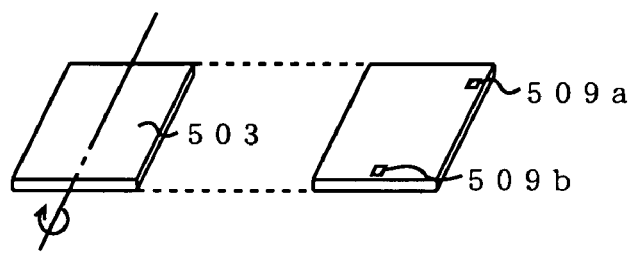

Although the present embodiment illustrates an example where metal strips are provided on only one face of the die pad 507, such metal strips may be formed on both faces of the die pad 507, as shown in FIGS. 11A, 11B, and 11C. FIGS. 11A, 11B, and 11C are perspective views showing the outer appearance of component elements used in a variant of the semiconductor device according to the fifth embodiment of the present invention, where metal strips 551a and 551b are provided on the respective faces of the die pad 507. As shown in FIG. 11B, the metal strip 551a interconnects the connection members 510b and 510c on one face of the die pad 507, whereas the metal strip 551b interconnects the connection members 510a and 510d on the opposite face of the die pad 507.

By thus providing metal strips on both faces of the die pad 507, it may become possible to realize a straightforward arrangement for metal strips which would inevitably intersect one another if provided on only one face. This provides more liberty in the designing of the semiconductor device.

Although the present embodiment illustrates an example where metal strips are provided on the die pad of the semiconductor device according to the first embodiment, the concept of metal strips provided on a die pad can also be extended to the second or third embodiment, for example, without limitation. Furthermore, the same concept is also applicable to the semiconductor assembly described in the first to third embodiments.

In the first to fifth embodiments above, the connection between the connection pads of the first semiconductor chip connection members and the connection between the connection pads of the second semiconductor chip and the connection members are realized by means of wires.

However, these connections can be realized by other means besides wires. As a sixth embodiment, a semiconductor device in which semiconductor chips are interconnected without employing wires will be described below.

(Sixth Embodiment)

A semiconductor device according to a sixth embodiment of the present invention will be described with reference to FIGS. 12A, 12B, 12C, and FIG. 13.

Figure 12A:
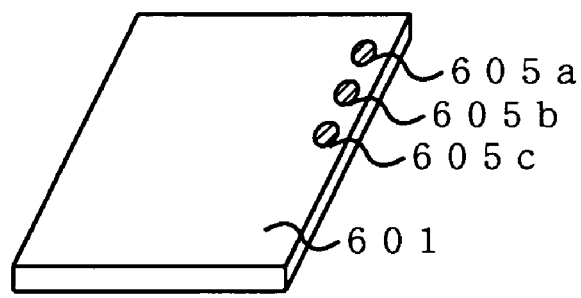
FIGS. 12A, 12B, and 12C are perspective views showing the outer appearance of component elements used in a semiconductor device according to a sixth embodiment of the present invention.
Figure 12B:
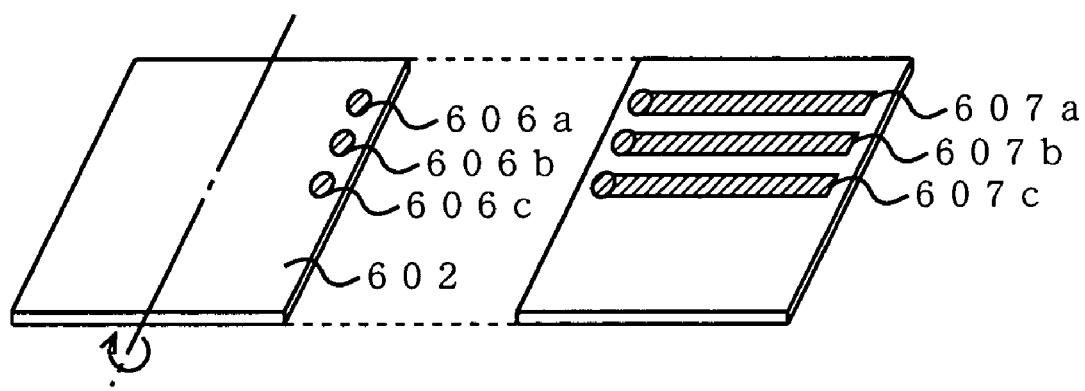
Figure 12C:
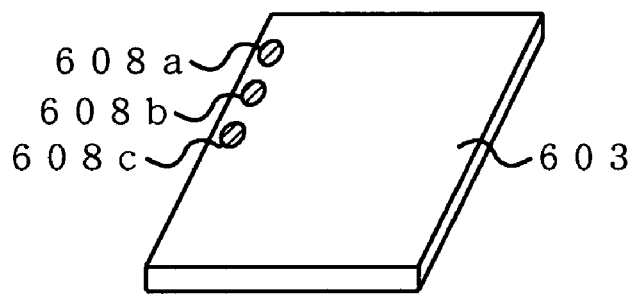
Figure 13:
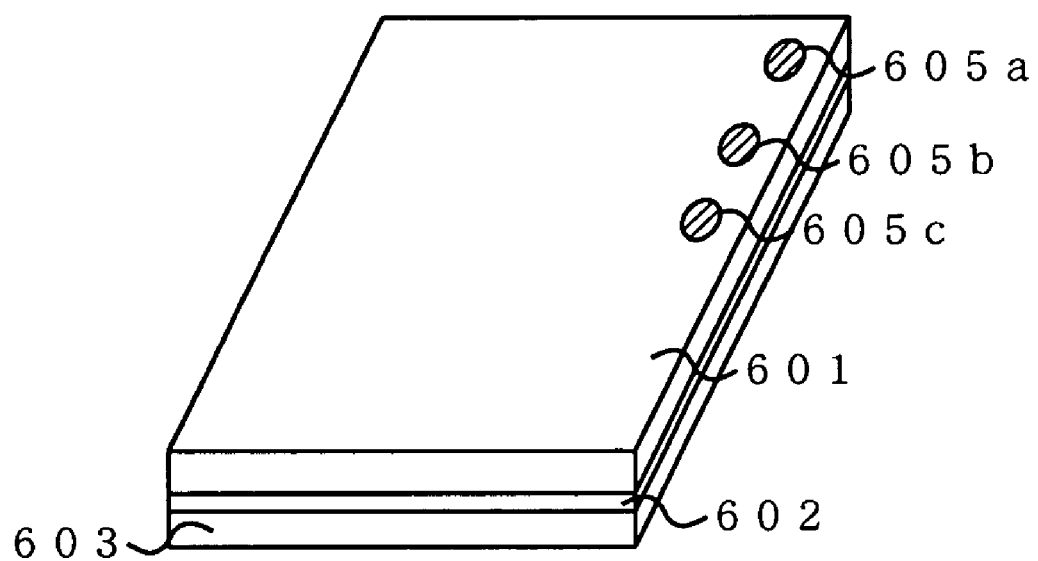
FIG. 13 is a perspective view showing the outer appearance of the semiconductor device according to the sixth embodiment of the present invention.

FIGS. 12A, 12B, and 12C are perspective views showing the outer appearance of component elements used in the semiconductor device according to the sixth embodiment of the present invention. FIG. 12A shows a first semiconductor chip 601. FIG. 12B shows a die pad 602, with a front face being shown in the left-hand view, and a back face shown in the right-hand view. Note that FIG. 12B only shows a mount portion of the die pad on which semiconductor chips are to be placed; other portions of the die pad are omitted from illustration. FIG. 12C shows a second semiconductor chip 603. FIG. 13 is a perspective view showing the outer appearance of the semiconductor device, as constructed by assembling the first semiconductor chip 601, the die pad 602, and the second semiconductor chip 603. In FIG. 13, external leads and a package are omitted from illustration.

The first semiconductor chip 601 includes circuitry formed on a face shown upwards in FIG. 12A. Furthermore, apertures are formed through the first semiconductor chip 601, with metal pieces 605a, 605b, and 605c embedded in the apertures.

Apertures are formed through the die pad 602 in portions which come into contact with the metal pieces 605a to 605c when the first semiconductor chip 601 is stacked onto the die pad 602. Metal pieces 606a, 606b, and 606c are embedded in these apertures in the die pad 602. On the back face of the die pad 602, metal strip 607a, 607b, and 607c, which are electrically connected to the metal pieces 606a, 606b, and 606c, respectively, are formed by plating.

The second semiconductor chip 603 includes circuitry formed on a face shown downwards in FIG. 12C. Furthermore, apertures are formed through the second semiconductor chip 603 in portions which come into contact with the metal strips 607a to 607c when the die pad 602 is stacked onto the second semiconductor chip 603. Metal pieces 608a, 608b, and 608c are embedded in these apertures in the second semiconductor chip 603.

The semiconductor device comprising the first semiconductor chip 601, the die pad 602, and the second semiconductor chip 603 will be described with reference to FIG. 13.

The first semiconductor chip 601 is attached to a front face of the mount portion of the die pad 602 so that its circuit face faces upwards in FIG. 12A, 12B, or 12C. The second semiconductor chip 603 is attached to a back face of the mount portion of the die pad 602 so that its circuit face faces downwards in FIG. 12A, 12B, or 12C. In other words, the first semiconductor chip 601 and the second semiconductor chip 603 are attached to the die pad 602 "back-to-back", i.e., so that their respective circuit faces face away from each other. The second semiconductor chip 603 and the die pad 602 are attached together by using a non-conductive adhesive in order to prevent short-circuiting between the metal strips 607a to 607c and the second semiconductor chip 603.

As described above, the metal pieces 605a to 605c in the first semiconductor chip 601 are disposed so as to come in contact with the metal pieces 606a to 606c, respectively, in the die pad 602. The metal strip 607a to 607c on the die pad 602 are disposed so as to come in contact with the pieces 608a to 608c, respectively, in the second semiconductor chip 603. Thus, when the semiconductor device as shown in FIG. 13 is assembled, the first semiconductor chip 601 and the second semiconductor chip 603 are electrically interconnected within the semiconductor device.

Thus, the semiconductor device of the present embodiment not only provides the effects attained by the semiconductor device according to the first embodiment, but also has an advantage in that, since the first and second semiconductor chips 601 and 603 are interconnected by means of metal pieces and metal strips as described above, there are no wires projecting outside the semiconductor device. As a result, the present semiconductor device can be kept compact.

Although the first to sixth embodiments above illustrate examples where the first semiconductor chip and the second semiconductor chip are attached to each other "back-to-back",i.e., so that their respective circuit faces face away from each other, the manner of attaching the first semiconductor chip and the second semiconductor chip together is not limited thereto.

As a seventh embodiment, a semiconductor device in which two semiconductor chips are attached together in a different manner from those described in the first to sixth embodiments will be described below.

(Seventh Embodiment)

Figure 14:
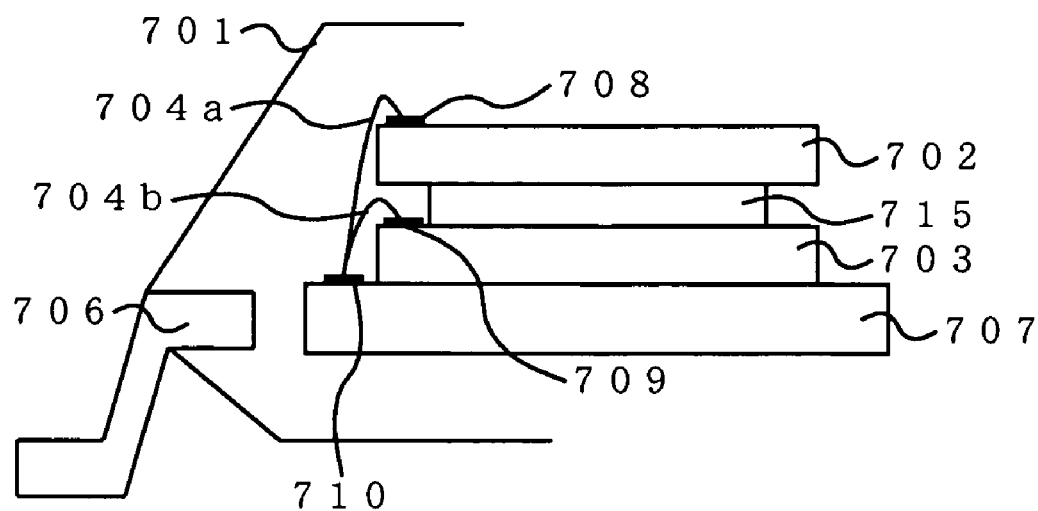
FIG. 14 is a cross-sectional view showing a semiconductor device according to a seventh embodiment of the present invention.

A semiconductor device according to a seventh embodiment of the present invention will be described with reference to FIG. 14. FIG. 14 is a cross-sectional view showing a semiconductor device according to the present embodiment of the present invention.

The semiconductor device according to the present embodiment comprises a package 701, a first semiconductor chip 702, a second semiconductor chip 703, inter-chip connection wires 704a and 704b, external leads 706, a die pad 707, and a spacer 715.

The package 701, the inter-chip connection wires 704a and 704b, and the external leads 706 are similar to those according to the first embodiment, and the descriptions thereof are omitted.

The first semiconductor chip 702 includes circuitry formed on an upper principal face as shown in FIG. 14, and includes connection pads 708 formed on this circuit face. The second semiconductor chip 703 includes circuitry formed on an upper principal face as shown in FIG. 14, and includes connection pads 709 formed on this circuit face.

The die pad 707 serves as a non-conductive mount on which to place the first semiconductor chip 702 and the second semiconductor chip 703, and includes connection members 710 formed on portions thereof. The die pad 707 has a larger outer contour than that of the first semiconductor chip 702 and the second semiconductor chip 703.

The connection members 710, which are formed by plating portions of the die pad 707, realize connection between the first semiconductor chip 702 and the second semiconductor chip 703. The spacer 715 serves to provide a space between the first semiconductor chip 702 and the second semiconductor chip 703 so as to allow inter-chip connection wires 704b to be connected to the connection pads 708 of the second semiconductor chip 703. The spacer 715 is composed of a non-conductive piece which is smaller than the first semiconductor chip 702 and the second semiconductor chip 703.

Next, the internal connection between the first semiconductor chip 702 and the second semiconductor chip 703 in the semiconductor device having the above-described structure will be described.

The second semiconductor chip 703 is attached to the die pad 707 so that its circuit face faces upwards as shown in FIG. 14. Furthermore, the spacer 715 is placed on the second semiconductor chip 703 so as to leave the connection pads 709 exposed. The first semiconductor chip 702 is attached to the spacer 715 so that its circuit face faces upwards as shown in FIG. 14. Thus, the first semiconductor chip 702 and the second semiconductor chip 703 are stacked together.

Then, the connection pads 708 of the first semiconductor chip 702 are connected to the respective connection members 710 of the die pad 707 by inter-chip connection wires 704a. Furthermore, the connection pads 709 of the second semiconductor chip 703 are connected to the respective connection members 710 of the die pad 707 by inter-chip connection wires 704b. Thus, the first semiconductor chip 702 and the second semiconductor chip 703 are electrically interconnected via the connection members 710.

Thus, the semiconductor device of the present embodiment not only provides the effects attained by the semiconductor device according to the first embodiment, but also has an advantage in that the first semiconductor chip 702 and the second semiconductor chip 703 can be easily interconnected even in the case where their circuit faces are oriented in the same direction, since the die pad 707 is placed underneath the first semiconductor chip 702 and the second semiconductor chip 703, such that the first semiconductor chip 702 and the second semiconductor chip 703 are interconnected via the connection members 710 on the die pad 707.

Although the present embodiment illustrates an example where the connection members 710 are provided on the die pad 707, the connection members may be provided on any element other than the die pad 707.

As an eighth embodiment, a variation of the seventh embodiment in which the connection members are provided on elements other than the die pad 707 will be described.

(Eighth Embodiment)

Figure 15:
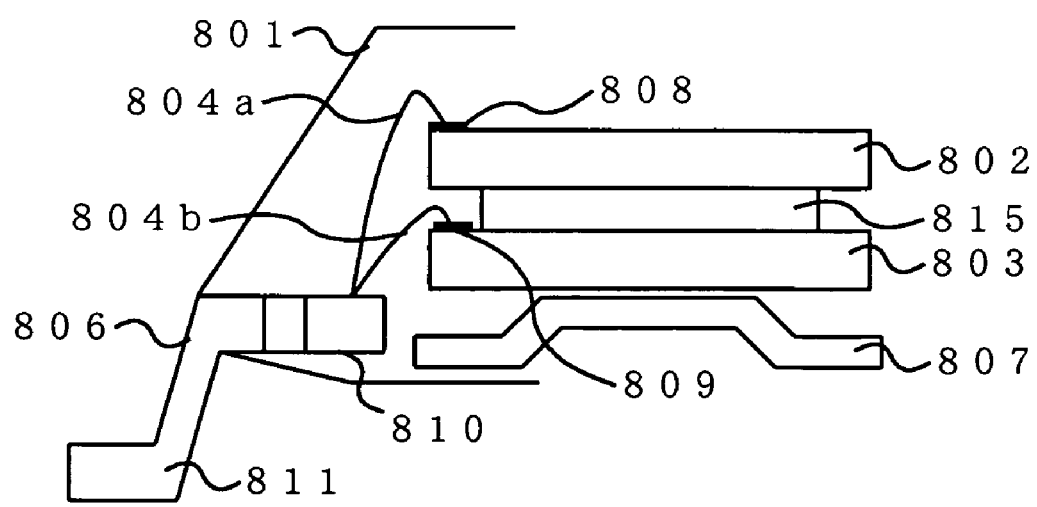
FIG. 15 is a cross-sectional view showing a semiconductor device according to an eighth embodiment of the present invention.

A semiconductor device according to an eighth embodiment of the present invention will be described with reference to FIG. 15. FIG. 15 is a cross-sectional view showing a semiconductor device according to the present embodiment of the present invention.

The semiconductor device according to the present embodiment comprises a package 801, a first semiconductor chip 802, a second semiconductor chip 803, inter-chip connection wires 804a and 804b, external leads 806, a die pad 807, and a spacer 815.

The package 801 and the inter-chip connection wires 804a and 804b are similar to those according to the first embodiment, and the descriptions thereof are omitted.

The first semiconductor chip 802, the second semiconductor chip 803, connection pads 808 and 809 formed respectively on the upper faces of the first and second semiconductor chips 802 and 803, and the spacer 815 are similar to those according to the seventh embodiment, and the descriptions thereof are omitted.

The die pad 807 serves as a non-conductive mount on which to place the first semiconductor chip 802 and the second semiconductor chip 803.

Now, the external leads 806 according to the present embodiment will be described. The external leads 806 according to the present embodiment have a similar structure to that of the external leads 406 according to the fourth embodiment. Specifically, each external lead 806 is composed of a non-conductive piece having a similar shape to that of the external leads 106 according to the first embodiment. A portion of the external lead 806 lying closer to the semiconductor device is plated to become a connection member 810 for realizing internal connection between the first semiconductor chip 802 and the second semiconductor chip 803. Another portion of the external lead 806 is also plated to become an external connection member 811 for connecting the present semiconductor device to an external device. As in the fourth embodiment, the connection member 810 of each external lead 806 is insulated from the external connection member 811 by a non-conductive portion.

Next, the internal connection between the first semiconductor chip 802 and the second semiconductor chip 803 in the semiconductor device having the above-described structure will be described.

The second semiconductor chip 803 is attached to the die pad 807 so that its circuit face faces upwards as shown in FIG. 15. Furthermore, the spacer 815 is placed on the second semiconductor chip 803 so as to leave the connection pads 809 exposed. The first semiconductor chip 802 is attached to the spacer 815 so that its circuit face faces upwards as shown in FIG. 15. Thus, the first semiconductor chip 802 and the second semiconductor chip 803 are stacked together.

Then, the connection pads 808 of the first semiconductor chip 802 are connected to the connection members 810 of the respective external leads 806 by inter-chip connection wires 804a. Furthermore, the connection pads 809 of the second semiconductor chip 803 are connected to the connection members 810 of the respective external leads 806 by inter-chip connection wires 804b. Thus, the first semiconductor chip 802 and the second semiconductor chip 803 are electrically interconnected via the connection members 810.

Thus, the semiconductor device of the present embodiment not only provides the effects attained by the semiconductor device according to the first embodiment, but also has an advantage in that the first semiconductor chip 802 and the second semiconductor chip 803 can be easily interconnected even in the case where their circuit faces are oriented in the same direction, as in the seventh embodiment.

According to the present embodiment, there is no need to design a special shape for the lead frame itself, as in the fourth embodiment.

The seventh and eighth embodiments illustrate examples where two semiconductor chips are stacked so that their circuit faces are oriented in the same direction, with a die pad being placed underneath the second semiconductor chip.

However, the die pad may be positioned in any place other than underneath the second semiconductor chip in the case where, as in the seventh and eighth embodiments, two semiconductor chips are stacked so that their circuit faces are oriented in the same direction.

As a ninth embodiment, a variation of the seventh embodiment in which a die pad is positioned in a place other than underneath the second semiconductor chip will be described.

(Ninth Embodiment)

A semiconductor device according to a ninth embodiment of the present invention will be described with reference to FIGS. 16A, 16B, and 16C.

Figure 16A:
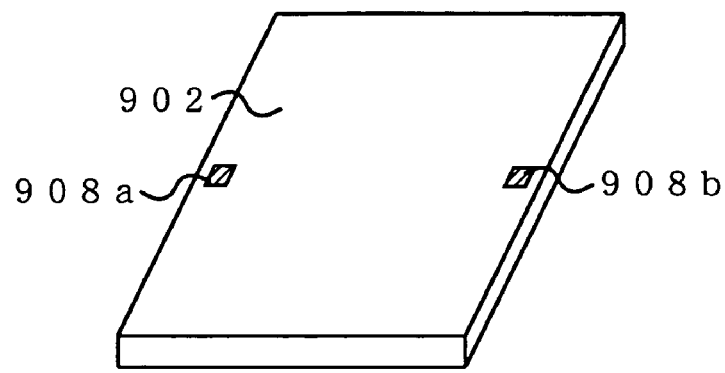
FIGS. 16A, 16B, and 16C are perspective views showing the outer appearance of component elements used in a semiconductor device according to a ninth embodiment of the present invention.
Figure 16B:
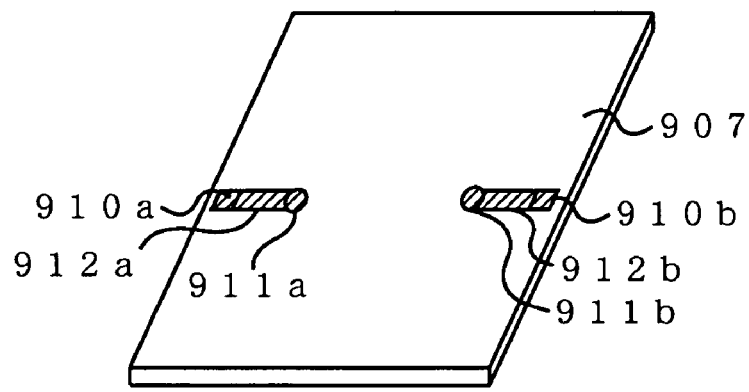
Figure 16C:
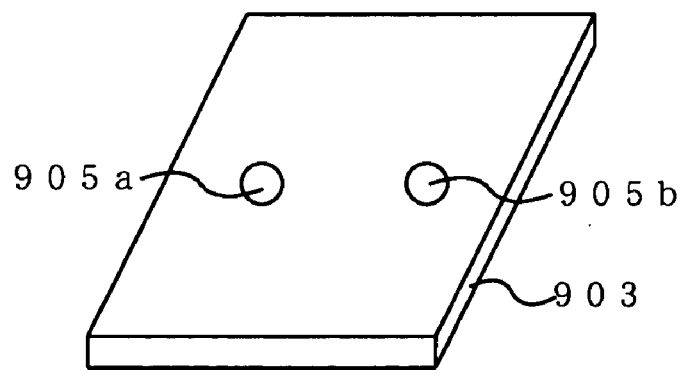

FIGS. 16A, 16B, and 16C are perspective views showing the outer appearance of component elements used in the semiconductor device according to the ninth embodiment of the present invention. FIG. 16A shows a first semiconductor chip 902. FIG. 16B shows a die pad 907. FIG. 16C shows a second semiconductor chip 903. The semiconductor device according to the present embodiment is constructed by attaching the first semiconductor chip 902 shown in FIG. 16A, the die pad 907 shown in FIG. 16B, and the second semiconductor chip 903 shown in FIG. 16C to one another. Hereinafter, each component element will be described in detail.

The first semiconductor chip 902 includes circuitry formed on a face shown upwards in FIG. 16A, and includes connection pads 908a and 908b formed on this circuit face. The connection pads 908a and 908b are used for external connection or for connection with the second semiconductor chip 903. The die pad 907 serves as a non-conductive mount on which to place the first semiconductor chip 902 and the second semiconductor chip 903. The die pad 907 includes a non-conductive mount portion and an outer framework as in the first embodiment (only the mount portion is shown in FIG. 16B). The mount portion has an outer contour which is larger than that of the first semiconductor chip 902 and the second semiconductor chip 903. The first semiconductor chip 902 is to be attached to the face of the mount portion shown upwards in FIG. 16B, and the second semiconductor chip 903 is to be attached to the opposite face of the mount portion. Near the edges of the mount portion, first connection members 910a and 910b are formed by plating. Also on the mount portion, metal strips 912a and 912b are formed by plating, so as to be electrically connected to the first connection members 910a and 910b, respectively. An aperture is formed through an end of each of the metal strips 912a and 912b, and metal pieces embedded in these apertures compose second connection members 911a and 911b, respectively. The second semiconductor chip 903 has substantially the same size as that of the first semiconductor chip 902. The second semiconductor chip 903 includes circuitry formed on a face shown upwards in FIG. 16C, and includes, on this circuit face, bumps 905a and 905b to be electrically connected to the second connection members 911a and 911b, respectively. The bumps 905a and 905b are formed in portions of the second semiconductor chip 903 that come respectively in contact with the second connection members 911a and 911b of the die pad 907 when the second semiconductor chip 903 is stacked on the die pad 907.

Figure 17:
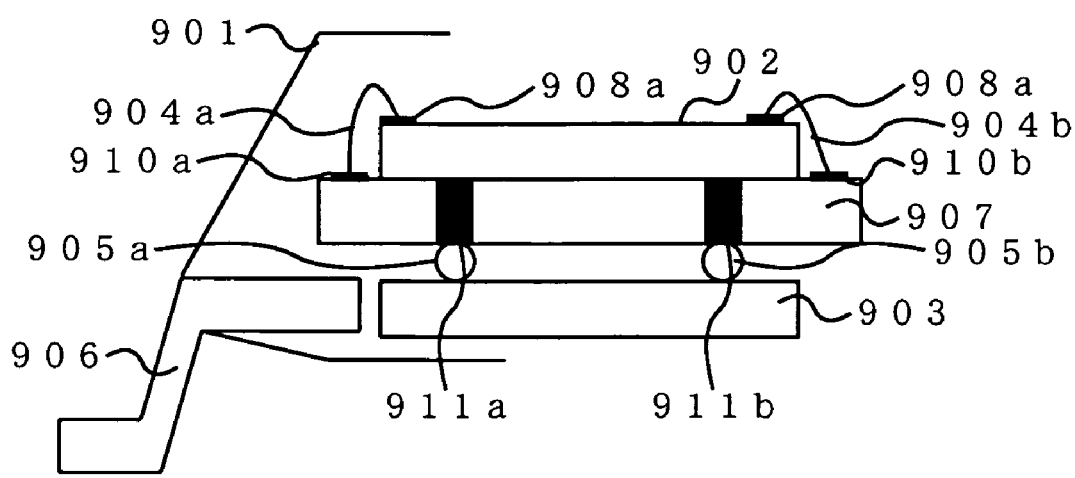
FIG. 17 is a cross-sectional view showing a semiconductor device according to a ninth embodiment of the present invention.
Figure 18:
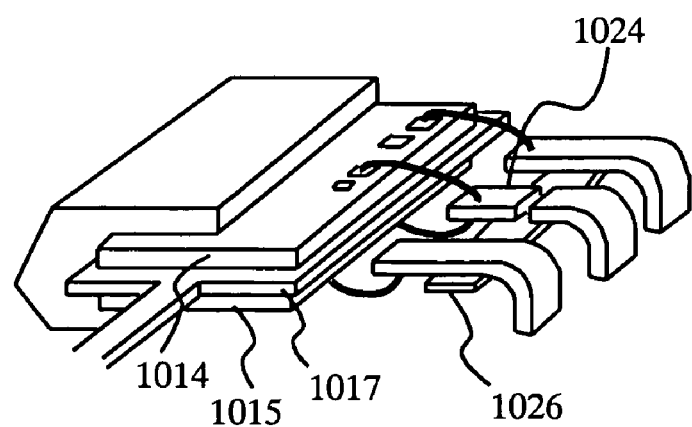
FIG. 18 is a perspective view showing the outer appearance of a conventional semiconductor device.

Now, the structure of the semiconductor device according to the present embodiment will be described. FIG. 17 is a cross-sectional view showing the semiconductor device according to the present embodiment.

The semiconductor device according to the present embodiment comprises a package 901, the first semiconductor chip 902, the second semiconductor chip 903, inter-chip connection wires 904a and 904b, the bumps 905a and 905b, external leads 906, and the die pad 907.

The package 901, the first semiconductor chip 902, the inter-chip connection wires 904a and 904b, and the external leads 906 are similar to those according to the first embodiment, and the descriptions thereof are omitted.

The first connection members 910a and 910b, the metal strips 912a and 912b, and the second connection members 911a and 911b realize connection between the first semiconductor chip 902 and the second semiconductor chip 903.

Next, the internal connection between the first semiconductor chip 902 and the second semiconductor chip 903 in the semiconductor device having the above-described structure will be described.

The first semiconductor chip 902 is attached to a front face of the mount portion of the die pad 907 so that its circuit face faces upwards in FIG. 17. The first semiconductor chip 902 and the die pad 907 are attached together by using a non-conductive adhesive in order to prevent short-circuiting between the metal strips 912a and 912b and the first semiconductor chip 902.

In order to internally connect the first semiconductor chip 902 and the second semiconductor chip 903 within the present semiconductor device, the connection pad 908a of the first semiconductor chip 902 and the first connection member 910a are interconnected by the inter-chip connection wire 904a. The connection pad 908b of the first semiconductor chip 902 and the first connection member 910b are interconnected by the inter-chip connection wire 904b.

Next, the second semiconductor chip 903 is attached to a back face of the mount portion of the die pad 907 so that its circuit face faces upwards in FIG. 17, with the bumps 905a and 905b interposed between the second semiconductor chip 903 and the die pad 907. Note that the second semiconductor chip 903 is attached to the die pad 907 so that the bumps 905a and 905b coincide with the second connection members 911a and 911b, respectively. Thus, the first semiconductor chip 902 and the second semiconductor chip 903 are electrically interconnected via the first connection members 910a and 910b, the metal strips 912a and 912b, and the second connection members 911a and 911b.

Thus, the semiconductor device of the present embodiment not only provides the effects attained by the semiconductor device according to the first embodiment, but also has an advantage in that the first semiconductor chip 902 and the second semiconductor chip 903 can be interconnected even in the case where their circuit faces are oriented in the same direction with die pad 907 interposed therebetween, since the die pad 907 and the second semiconductor chip 903 are electrically interconnected by the bumps 905a and 905b.

The semiconductor device according to the present embodiment may also be produced from a semiconductor assembly as described in the first embodiment.

Although the present embodiment illustrates an example where the first semiconductor chip 902 and the die pad 907 are attached together by using a non-conductive adhesive in order to prevent short-circuiting between the metal strips 912a and 912b and the first semiconductor chip 902, any other means for ensuring isolation between the metal strips 912a and 912b on the die pad 907 and the first semiconductor chip 902 may be used. For example, a non-conductive film may be attached to a principle face of the mount portion having the metal strips 912a and 912b formed thereon, and thereafter the first semiconductor chip 902 may be attached onto the non-conductive film. Instead of a non-conductive film, a plate composed of the same non-conductive material as that composing the die pad 907 may be attached to the die pad 907 having the metal strips 912a and 912b formed thereon.

The present embodiment illustrates an example where the circuit face of the first semiconductor chip 903 and the circuit face of the second semiconductor chip 903 are oriented in the same direction. Alternatively, the two circuit faces may oppose each other, with the die pad 907 interposed therebetween. In this case, the first semiconductor chip 902 and the die pad 907 are to be interconnected via the bumps.

In the first to ninth embodiments above, the package may be a ceramic package formed so as to be hollow between leads, or a ceramic package formed so as not to be hollow between leads.

In the first to ninth embodiments, the first semiconductor chip and the second semiconductor chip are illustrated as being of substantially the same size. As used herein, the two semiconductor chips being "of substantially the same size" means that, when the first semiconductor chip and the second semiconductor chip are layered in place, the portion of the larger one of the semiconductor chips that lies outside of the smaller semiconductor chip is not large enough for accommodating any connection pads.

Although each of the first to ninth embodiments illustrates an example where two semiconductor chips are stacked, three or more semiconductor chips may be stacked to compose the semiconductor device, as realized by combining the layering methods according to the first to ninth embodiments.

Plating or embedded metal pieces described in any of the first to ninth embodiments above are mere examples of conductive elements. It will be appreciated that such elements may be replaced by, for example, pieces of resin which has been imparted with electrical conductivity.

While the invention has been described in detail, the foregoing description is in all aspects illustrative and not restrictive. It is understood that numerous other modifications and variations can be devised without departing from the scope of the invention.

What is claimed is:

1. A semiconductor device including a plurality of layers of semiconductor chips having substantially the same outer contour, with an integrated circuit being formed on a principal face of each semiconductor chip, comprising:
   a non-conductive layer having a conductive portion provided thereon, and
   an internal connection member for internally connecting the integrated circuits formed on the plurality of semiconductor chips via the conductive portion provided on the non-conductive layer,
   an external lead, which is electrically separated from said internal connection member, for connecting the semiconductor device to an external device,
   wherein the conductive portion provided on the non-conductive layer only mediates internal connection between the integrated circuits formed on the plurality of semiconductor chips.

2. The semiconductor device according to claim 1, wherein, the plurality of semiconductor chips comprise a first semiconductor chip and a second semiconductor chip, and
   the internal connection member comprises:
   a first connection member for connecting the first semiconductor chip to the conductive portion; and
   a second connection member for connecting the second semiconductor chip to the conductive portion.

3. The semiconductor device according to claim 2, wherein, the non-conductive layer has a circuit formed thereon, and
   the conductive portion comprises a conductive subportion which is connected to the first connection member and a conductive subportion which is connected to the second connection member, the conductive subportions being in electrical conduction by way of the circuit formed on the non-conductive layer.

4. The semiconductor device according to claim 2, wherein the first semiconductor chip is disposed so that a principal face of the first semiconductor chip not bearing the integrated circuit opposes one of principal faces of the non-conductive layer, and the second semiconductor chip is disposed so that a principal face of the second semiconductor chip having the integrated circuit formed thereon opposes the other principal face of the non-conductive layer.

5. The semiconductor device according to claim 4, wherein the second connection member is a metal bump provided on the second semiconductor chip, the conductive portion including:

a conductive subportion embedded in an aperture formed through a portion of the non-conductive layer that comes in contact with the bump when the second semiconductor chip and the non-conductive layer are layered in place, and a circuit, formed on the principal face of the non-conductive layer opposed by the first semiconductor chip, for electrically connecting the conductive subportion to the first connection member.

6. The semiconductor device according to claim 2, wherein, the second semiconductor chip is disposed so that a principal face of the second semiconductor chip not bearing the integrated circuit contacts a principal face of the non-conductive layer, the semiconductor device further comprising:

a spacer having an outer contour which is smaller than an outer contour of the first semiconductor chip and the second semiconductor chip, the spacer being disposed on the principal face of the second semiconductor chip having the integrated circuit formed thereon, and the first semiconductor chip is disposed so that a principal face of the first semiconductor chip not bearing the integrated circuit contacts an upper face of the spacer.

7. The semiconductor device according to claim 1, wherein the non-conductive layer is a mount on which the plurality of semiconductor chips are placed.

8. The semiconductor device according to claim 1, wherein the conductive portion is formed by plating, with a conductive material, a portion of the non-conductive layer that lies outside of an outer contour of the plurality of semiconductor chips when the plurality of semiconductor chips and the non-conductive layer are layered in place.

9. A semiconductor device, including a plurality of layers of semiconductor chips having substantially the same outer contour, with an integrated circuit being formed on a principal face of each semiconductor chip, comprising:

a non-conductive layer having a conductive portion provided thereon, and an internal connection member for internally connecting the integrated circuits formed on the plurality of semiconductor chips via the conductive portion provided on the non-conductive layer, wherein the conductive portion provided on the non-conductive layer only mediates internal connection between the integrated circuits formed on the plurality of semiconductor chips, and the plurality of semiconductor chips comprise a first semiconductor chip and a second semiconductor chip, and the internal connection member comprises:

a first connection member for connecting the first semiconductor chip to the conductive portion; and a second connection member for connecting the second semiconductor chip to the conductive portion, and the non-conductive layer has a circuit formed thereon, and the conductive portion comprises a conductive subportion which is connected to the first connection member and a conductive subportion which is connected to the second connection member, the conductive subportions being in electrical conduction by way of the circuit formed on the non-conductive layer, wherein the non-conductive layer includes a circuit formed on each of two principal faces thereof.

10. A semiconductor device, including a plurality of layers of semiconductor chips having substantially the same outer contour, with an integrated circuit being formed on a principal face of each semiconductor chip, comprising:

a non-conductive layer having a conductive portion provided thereon, and an internal connection member for internally connecting the integrated circuits formed on the plurality of semiconductor chips via the conductive portion provided on the non-conductive layer, wherein the conductive portion provided on the non-conductive layer only mediates internal connection between the integrated circuits formed on the plurality of semiconductor chips, wherein, the plurality of semiconductor chips comprise a first semiconductor chip and a second semiconductor chip, and the internal connection member comprises:

a first connection member for connecting the first semiconductor chip to the conductive portion; and a second connection member for connecting the second semiconductor chip to the conductive portion, wherein the non-conductive layer is layered between the first semiconductor chip and the second semiconductor chip.

11. The semiconductor device according to claim 10, wherein the first semiconductor chip and the second semiconductor chip are disposed so that the respective principal faces of the first and second semiconductor chips having the integrated circuits formed thereon face away from each other, with the non-conductive layer being interposed between the other principal faces of the first and second semiconductor chips.

12. The semiconductor device according to claim 11, wherein the conductive subportion which is connected to the first connection member is formed on a principal face of the non-conductive layer which is oriented in the same direction as the principal face of the first semiconductor chip on which the integrated circuit is formed.

13. The semiconductor device according to claim 10, wherein, the first connection member is composed of a conductive piece embedded in an aperture formed through the first semiconductor chip, the second connection member is composed of a conductive piece embedded in an aperture formed through the second semiconductor chip, the first connection member and the second connection member are formed in positions which coincide when the first semiconductor chip and the second semiconductor chip are layered in place, and the conductive portion comprises conductive pieces embedded in apertures formed through portions of the non-conductive layer that come in contact with the first connection member and the second connection member, respectively, when the first semiconductor chip and the second semiconductor chip are layered in place.

14. The semiconductor device according to claim 13, wherein the conductive piece composing the first connection member is a metal piece.

15. The semiconductor device according to claim 10, wherein, the first connection member is composed of a conductive piece embedded in an aperture formed through the first semiconductor chip,
the second connection member is composed of a conductive piece embedded in an aperture formed through the second semiconductor chip, and
the conductive portion comprises:
a conductive subportion composed of a conductive piece embedded in an aperture formed through a portion of the non-conductive layer that comes in contact with the first connection member when the first semiconductor chip and the second semiconductor chip are layered in place, and
a circuit for electrically connecting the conductive subportion to a portion of the non-conductive layer that comes in contact with the second connection member when the first semiconductor chip and the second semiconductor chip are layered in place.

16. A semiconductor device, including a plurality of layers of semiconductor chips having substantially the same outer contour, with an integrated circuit being formed on a principal face of each semiconductor chip, comprising:
a non-conductive layer having a conductive portion provided thereon, and
an internal connection member for internally connecting the integrated circuits formed on the plurality of semiconductor chips via the conductive portion provided on the non-conductive layer,
wherein the conductive portion provided on the non-conductive layer only mediates internal connection between the integrated circuits formed on the plurality of semiconductor chips, and
wherein the conductive portion is formed by plating, with a conductive material, a portion of the non-conductive layer that lies outside of an outer contour of the plurality of semiconductor chips when the plurality of semiconductor chips and the non-conductive layer are layered in place,
wherein the conductive material is a metal.

17. A semiconductor device, including a plurality of layers of semiconductor chips having substantially the same outer contour, with an integrated circuit being formed on a principal face of each semiconductor chip, comprising:
a non-conductive layer having a conductive portion provided thereon, and
an internal connection member for internally connecting the integrated circuits formed on the plurality of semiconductor chips via the conductive portion provided on the non-conductive layer,
wherein the conductive portion provided on the non-conductive layer only mediates internal connection between the integrated circuits formed on the plurality of semiconductor chips, and
wherein the conductive portion is formed by plating, with a conductive material, a portion of the non-conductive layer that lies outside of an outer contour of the plurality of semiconductor chips when the plurality of semiconductor chips and the non-conductive layer are layered in place,
wherein the portion of the non-conductive layer that lies outside of the outer contour of the plurality of semiconductor chips is a protrusion from the non-conductive layer.

18. A semiconductor device, including a plurality of layers of semiconductor chips having substantially the same outer contour, with an integrated circuit being formed on a principal face of each semiconductor chip, comprising:
a non-conductive layer having a conductive portion provided thereon, and
an internal connection member for internally connecting the integrated circuits formed on the plurality of semiconductor chips via the conductive portion provided on the non-conductive layer,
wherein the conductive portion provided on the non-conductive layer only mediates internal connection between the integrated circuits formed on the plurality of semiconductor chips, and
wherein the conductive portion is formed by plating, with a conductive material, a portion of the non-conductive layer that lies outside of an outer contour of the plurality of semiconductor chips when the plurality of semiconductor chips and the non-conductive layer are layered in place,
wherein, the plurality of semiconductor chips and the non-conductive layer are encased in a package,
the non-conductive layer further includes
a plurality of supporting legs for stabilizing to the package a portion of the non-conductive layer on which the plurality of semiconductor chips are placed,
the plurality of supporting legs being connected to one another by a bridge, and
the portion of the non-conductive layer that lies outside of the outer contour of the plurality of semiconductor chips forms the bridge.

19. A semiconductor device, including a plurality of layers of semiconductor chips having substantially the same outer contour, with an integrated circuit being formed on a principal face of each semiconductor chip, comprising:
a non-conductive layer having a conductive portion provided thereon, and
an internal connection member for internally connecting the integrated circuits formed on the plurality of semiconductor chips via the conductive portion provided on the non-conductive layer,
wherein the conductive portion provided on the non-conductive layer only mediates internal connection between the integrated circuits formed on the plurality of semiconductor chips, and
wherein the conductive portion is composed of a conductive piece embedded in an aperture formed through a portion of the non-conductive layer that lies outside of an outer contour of the plurality of semiconductor chips when the plurality of semiconductor chips and the non-conductive layer are layered in place.

20. The semiconductor device according to claim 19 or 13, wherein the conductive pieces comprised by the conductive portion are metal pieces.

21. A semiconductor device including a plurality of layers of semiconductor chips having substantially the same outer contour, with an integrated circuit being formed on a principal face of each semiconductor chip, comprising:
a non-conductive layer having a first conductive portion and a second conductive portion provided thereon, and
an internal connection member for internally connecting the integrated circuits formed on the plurality of semiconductor chips via the first conductive portion provided on the non-conductive layer,
wherein the second conductive portion provided on the non-conductive layer is a terminal for connecting the integrated circuits formed on the plurality of semiconductor chips to an external circuit.

* * * * *